(12) United States Patent
Emley et al.

(10) Patent No.: US 8,813,324 B2
(45) Date of Patent: Aug. 26, 2014

(54) METHOD FOR PROVIDING A PIEZOELECTRIC MULTILAYER

(75) Inventors: Nathan C. Emley, San Francisco, CA (US); Donghong Li, Pleasanton, CA (US); Prakash Mani, Fremont, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 0 days.

(21) Appl. No.: 13/460,190

(22) Filed: Apr. 30, 2012

(65) Prior Publication Data

US 2012/0216378 A1  Aug. 30, 2012

Related U.S. Application Data

(62) Division of application No. 12/730,968, filed on Mar. 24, 2010, now abandoned.

(51) Int. Cl.
| | |
|---|---|
| *H01L 41/22* | (2013.01) |
| *H01L 41/083* | (2006.01) |
| *H01L 41/27* | (2013.01) |
| *H01L 41/273* | (2013.01) |
| *H01L 41/277* | (2013.01) |
| *H01L 41/293* | (2013.01) |
| *H01L 41/297* | (2013.01) |
| *H01L 41/314* | (2013.01) |
| *H01L 41/332* | (2013.01) |

(52) U.S. Cl.
CPC .............. *H01L 41/27* (2013.01); *H01L 41/273* (2013.01); *H01L 41/277* (2013.01); *H01L 41/293* (2013.01); *H01L 41/297* (2013.01); *H01L 41/314* (2013.01); *H01L 41/332* (2013.01); *H01L 41/083* (2013.01)
USPC ................ 29/25.35; 29/830; 29/842; 29/846; 29/852; 310/328; 310/366; 427/100

(58) Field of Classification Search
CPC ...... H01L 41/27; H01L 41/273; H01L 41/293; H01L 41/297; H01L 41/314; H01L 41/332; H01L 41/083; H01L 41/277
USPC ......... 29/25.35, 842, 846, 830, 852; 310/328, 310/366; 427/100
See application file for complete search history.

(56) References Cited

U.S. PATENT DOCUMENTS

| | | |
|---|---|---|
| 4,471,256 A | 9/1984 | Igashira et al. |
| 4,523,121 A | 6/1985 | Takahashi et al. |

(Continued)

FOREIGN PATENT DOCUMENTS

JP  06120583 A  * 4/1994  ................... 29/25.35

OTHER PUBLICATIONS

Office Action issued in U.S. Appl. No. 12/730,968 on Sep. 21, 2011.

(Continued)

*Primary Examiner* — A. Dexter Tugbang

(57) ABSTRACT

A method for fabricating a piezoelectric multilayer are described. The method includes providing conductive layers. Alternating conductive layers are electrically connected. A first plurality of alternating conductive layers is electrically isolated from a second plurality of alternating conductive layers. Piezoelectric layers are interleaved with the conductive layers. Apertures are provided in the piezoelectric layers. A first conductive plug electrically connects the first plurality of alternating conductive layers, includes a first plurality of segments, and is in apertures in the piezoelectric layers. Each of the first plurality of segments extends through one of the piezoelectric layers. A second conductive plug electrically connects the second plurality of alternating conductive layers, includes a second plurality of segments, and is in a second portion of the plurality of apertures. Each of the second plurality of segments extends through one of the plurality of piezoelectric layers.

14 Claims, 17 Drawing Sheets

(56) References Cited

U.S. PATENT DOCUMENTS

| | | | |
|---|---|---|---|
| 4,759,107 A | 7/1988 | Ogawa et al. | |
| 5,359,760 A | 11/1994 | Busse et al. | |
| 5,607,535 A | 3/1997 | Tsukada et al. | |
| 5,639,508 A | 6/1997 | Okawa et al. | |
| 5,877,581 A | 3/1999 | Inoi et al. | |
| 5,942,063 A | 8/1999 | Mori | |
| 6,051,911 A | 4/2000 | Kojima et al. | |
| 6,114,798 A | 9/2000 | Maruyama et al. | |
| 6,183,578 B1 | 2/2001 | Ritter et al. | |
| 6,329,741 B1 | 12/2001 | Vartuli et al. | |
| 6,501,625 B1 | 12/2002 | Boismier et al. | |
| 6,624,550 B2 | 9/2003 | Biesenecker et al. | |
| 6,668,437 B1 * | 12/2003 | Maruyama et al. | 29/25.35 |
| 6,673,461 B2 | 1/2004 | Chazono et al. | |
| 6,929,849 B2 | 8/2005 | Koskenmaki et al. | |
| 6,986,189 B2 * | 1/2006 | Kitahara | 29/25.35 |
| 7,164,184 B2 | 1/2007 | Togashi | |
| 7,304,414 B2 | 12/2007 | Florian et al. | |
| 2004/0104978 A1 | 6/2004 | Iwashita et al. | |

OTHER PUBLICATIONS

Final Office Action issued in U.S. Appl. No. 12/730,968 on Feb. 1, 2012.

Advisory Action issued in U.S. Appl. No. 12/730,968 on Apr. 9, 2012.

* cited by examiner

METHOD FOR PROVIDING A PIEZOELECTRIC MULTILAYER

CROSS-REFERENCE TO RELATED APPLICATIONS

This application is a divisional of U.S. patent application Ser. No. 12/730,968 entitled METHOD AND SYSTEM FOR PROVIDING A PIEZOELECTRIC MULTILAYER, filed on Mar. 24, 2010 and assigned to the assignee of the present application.

BACKGROUND

Piezoelectric materials are used for a number of applications. For example, piezoelectric materials may be used in actuators to achieve precise positioning in response to an applied electrical signal. Such applications may be used in devices such as disk drives. Multilayered piezoelectric/conductor stacks are of interest because of their higher piezoelectric response per volt than single layer piezoelectric devices. In other words, a piezoelectric multilayer has a higher displacement and force per volt than a single layer piezoelectric having a comparable thickness. FIG. 1 depicts such a conventional piezoelectric multilayer 10. For simplicity, only portions of the conventional piezoelectric multilayer 10 are shown. The conventional piezoelectric multilayer 10 is formed on a substrate 10 and includes piezoelectric material 20 and conventional conductive structures 30 and 40. The piezoelectric material 20 is actually composed of layers 22. Each conventional conductive structure 30 and 40 includes conductive plates 32 and 42, respectively. The conductive plates 32 are interleaved with the conductive plates 42. In other words, conductive plates 32 alternate with conductive plates 42 as the piezoelectric material 20 is traversed vertically in FIG. 1. The conventional conductive structures 30 and 40, and thus conductive plates 32 and 42, respectively, are electrically isolated. The conductive plates 32 and 42 are also spaced apart by a distance, d. Generally d, or the thickness of a piezoelectric layer 22, is constant through the piezoelectric material 20. Typically, d is greater than one micron.

In operation, the conventional conductive structures 30 and 40 are typically held at differing potentials, V+ and V−. As a result, each layer 22 of the piezoelectric material 20 is subject to the same electric field that alternates in direction between the layers 22. As a result of the potential difference between the conductive plates 32 and 42, a response is induced in the layers 22 of the piezoelectric material 20.

Various methods may be employed to fabricate the conventional piezoelectric multilayer 10. For example, the piezoelectric material 20 may be composed of layers which are defined using a thick film method. Alternatively, bulk sheets of piezoelectric may be laminated. Connection may be made to the conductive plates 32 and 42 through vias (not explicitly shown in FIG. 1) that are etched in the bulk piezoelectric material 20, and then refilled. Such conventional piezoelectric multilayers 10 are generally on the order of tens of microns thick, or greater.

Although the conventional piezoelectric multilayer 10 may be fabricated, other mechanisms for forming the multilayer 10 are desired. For example, the ability to obtain the desired geometry and thus voltage levels of the conventional piezoelectric multilayer 10 may be limited when using conventional fabrication methods. Accordingly, what is needed is an improved method for fabricating a piezoelectric multilayer.

SUMMARY

A method and system for providing a piezoelectric multilayer are described. The method and system include depositing a first conductive layer on a substrate and depositing a first piezoelectric layer on the first conductive layer. A portion of the first piezoelectric layer is removed to provide a first aperture therein. The first aperture exposes a portion of the first conductive layer. A portion of a first conductive plug is within the first aperture and electrically connected to the first conductive layer. The method and system also include depositing a second conductive layer on the first piezoelectric layer. A portion of the second conductive layer is removed to provide a second aperture therein. The second aperture exposes the first conductive plug and allows the second conductive layer to be electrically insulated from the first conductive plug. A second piezoelectric layer is deposited and covers the first conductive plug and the second conductive layer. A portion of the second piezoelectric layer is removed to provide a third aperture and a fourth aperture therein. The third aperture exposes the first conductive plug. The fourth aperture exposes an additional portion of the second conductive layer distal from the first conductive plug. A second portion of the first conductive plug is provided in the third aperture. A first portion of a second conductive plug is in the fourth aperture. The method and system also include depositing a third conductive layer electrically coupled to the first conductive plug. A portion of the third conductive layer is removed to form fifth aperture therein. The fifth aperture exposes the second conductive plug and allows the third conductive layer to be insulated from the second conductive plug. In another aspect, the method includes providing conductive layers. The conductive layer may include a first plurality of alternating conductive layers and a second plurality of alternating conductive layers. The first plurality of alternating conductive layers is electrically isolated from a second plurality of alternating conductive layers. The first plurality of alternating conductive layers is electrically connected. Similarly, the second plurality of alternating conductive layers is electrically connected. Piezoelectric layers are interleaved with the conductive layers. Apertures are provided in the piezoelectric layers. A first conductive plug electrically connects the first plurality of alternating conductive layers, includes a first plurality of segments, and is in apertures in the piezoelectric layers. Each of the first plurality of segments extends through one of the piezoelectric layers. A second conductive plug electrically connects the second plurality of alternating conductive layers, includes a second plurality of segments, and is in a second portion of the plurality of apertures. Each of the second plurality of segments extends through one of the plurality of piezoelectric layers

DETAILED DESCRIPTION OF THE PREFERRED EMBODIMENTS

Figure 1:
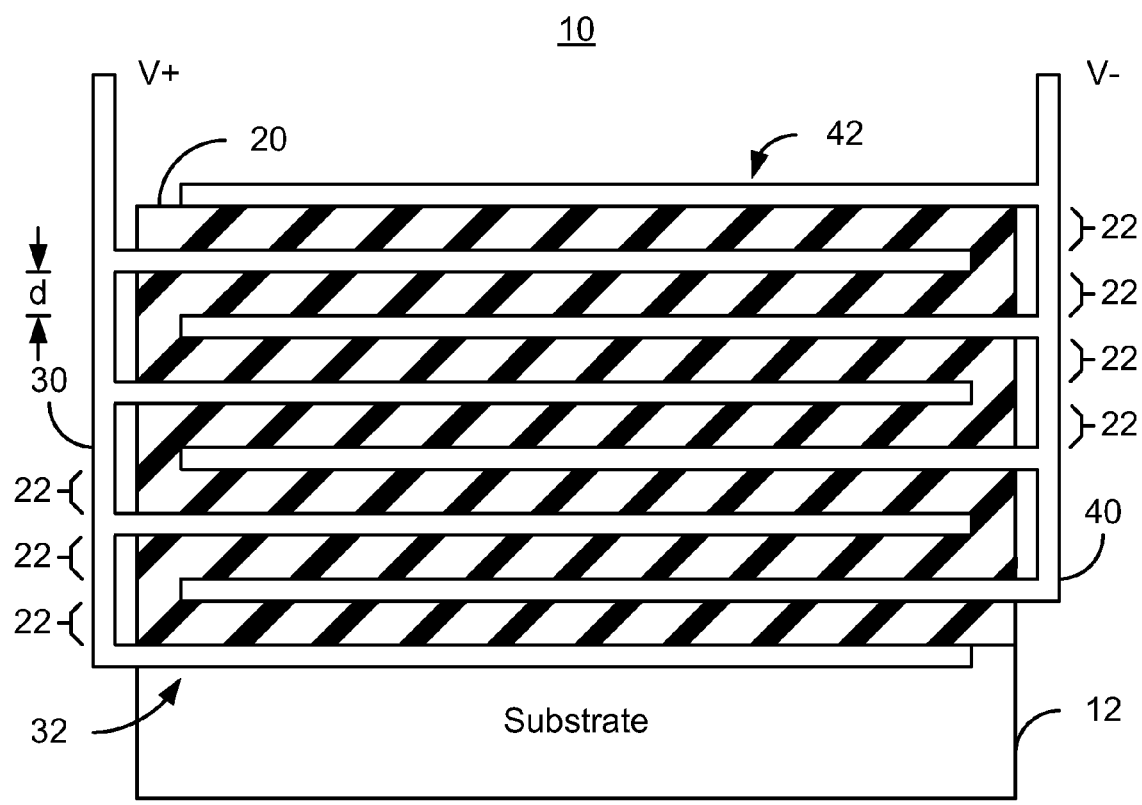
FIG. 1 is a diagram depicting a conventional piezoelectric multilayer.
Figure 2:
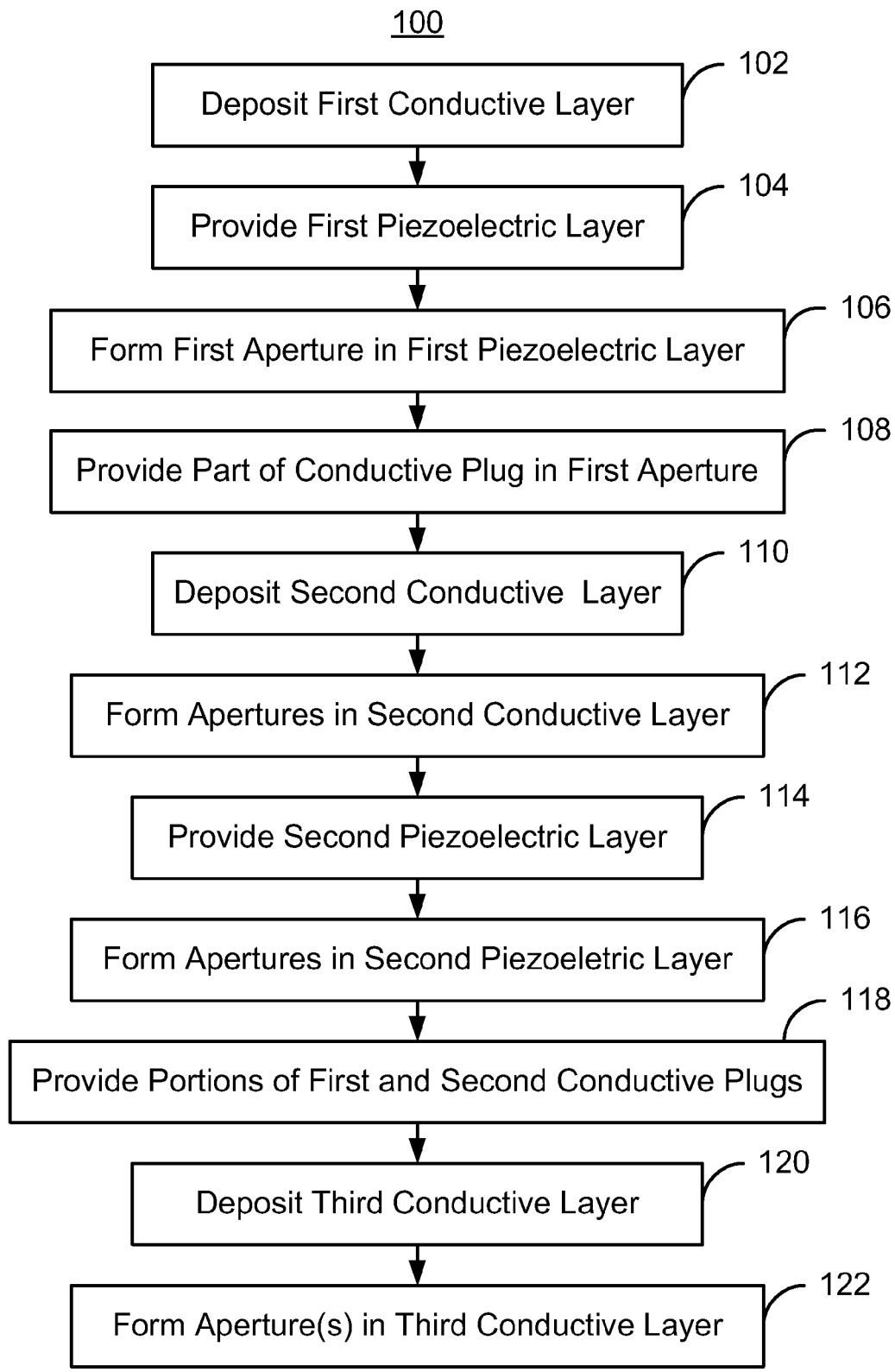
FIG. 2 is a flow chart depicting an exemplary embodiment of a method for fabricating a piezoelectric multilayer.

FIG. 2 is a flow chart depicting an exemplary embodiment of a method 100 for fabricating a piezoelectric multilayer. The method 100 is described in the context of a particular piezoelectric multilayer, though other multilayers might be so fabricated. For simplicity, some steps may be omitted and/or combined. The piezoelectric multilayer being fabricated may be used in a disk drive. The method 100 is also described in the context of providing a single piezoelectric multilayer and its associated structures. However, the method 100 may be used to fabricate multiple piezoelectric multilayers at substantially the same time. The method 100 and system are also described in the context of particular layers. However, in some embodiments, such layers may include multiple sublayers. In one embodiment, the method 100 commences after formation of the underlayer(s) or other structures on the substrate on which the piezoelectric multilayer is to reside.

A first conductive layer is deposited on a substrate, via step 102. The substrate might include materials such as Si, AlTiC, or other materials, including conductors. Step 102 may include providing an insulator such as $SiO_2$, $Si_3N_4$, $Al_2O_3$, and/or another insulator on the substrate. The insulator helps to preclude shorting through the substrate. The conductive layer may then be provided on the insulator. The conductive layer could be, for example, a Ti/Pt bilayer. However, in other embodiments, other conductive materials may be used.

A first piezoelectric layer is deposited on the first conductive layer, via step 104. For example, a material such as lead zirconate titanate (PZT) may be deposited. In general, step 104 includes annealing the material to achieve the desired crystal structure of the piezoelectric layer. For example, for PZT, the device may be annealed at approximately seven hundred degrees Celsius for approximately one minute. Thus, the materials used in the method 100 are generally desired to withstand such anneals. Further, the thickness of the piezoelectric layer may depend upon the application. In some embodiments, the piezoelectric layer may be less than or equal to one micron thick.

A part of the first piezoelectric layer is removed, via step 106. An aperture is thus provided in the first piezoelectric layer. Step 106 may include providing a mask that exposes the region of the first piezoelectric layer to be removed to form the aperture, then etching the first piezoelectric layer to form the aperture. For example, a reactive ion etch (RIE) having the appropriate chemistry for the selected piezoelectric layer may be used. Alternatively, ion milling, wet etching or other techniques might be used. Thus, the aperture is formed using photolithographic techniques. The aperture formed in step 106 exposes the underlying first conductive layer. Thus, electrical contact may be made to the first conductive layer.

A portion of a first conductive plug is provided within the first aperture, via step 108. Stated differently, a segment of the first conductive plug is fabricated in step 108. Step 108 may include depositing a seed layer, then plating a conductive material such as Au, Ni, NiFe and/or Cu. Because it is plated or deposited in an analogous manner, the conductive material may fill the aperture in the first piezoelectric layer. The first conductive plug being formed is, therefore, electrically connected to the first conductive layer. Step 108 may also include removing the seed layer and/or other conductive materials that reside outside of the aperture. For example, an ion mill may be used to remove the seed layer. A chemical mechanical planarization (CMP) may be performed to remove the portion of the conductive material outside of the aperture and provide a substantially flat surface of the first piezoelectric layer. In some embodiments, the thickness of the piezoelectric layer provided in step 104 may be greater than the desired thickness to account for the CMP that may be employed as part of step 108.

A second conductive layer is deposited on the first piezoelectric layer, via step 110. The second conductive layer is desired to be electrically isolated from the first conductive layer. Step 110 may include depositing a Pt or other metal layer. A portion of the second conductive layer is removed to provide a second aperture in the second conductive layer, via step 112. The aperture is aligned with and exposes the first conductive plug. The aperture may also be wider than the first conductive plug. The aperture in the second conductive layer thus allows the second conductive layer to be electrically insulated from the first conductive plug while allowing for further fabrication of the first conductive plug.

A second piezoelectric layer is deposited, via step 114. For example, the second piezoelectric layer may be a PZT layer. The second piezoelectric layer covers the first conductive plug and the second conductive layer. Because the aperture in the second conductive layer may have a larger footprint than the first conductive plug, the second piezoelectric layer may also overlap a portion of the first piezoelectric layer around the first conductive plug. Step 114 may also include annealing the material to achieve the desired crystal structure of the piezoelectric layer. In some embodiments, the thickness of the second piezoelectric layer provided in step 114 may be greater than the desired thickness to account for the CMP that may be employed as part of step 118, described below.

A part of the second piezoelectric layer is removed, via step 116. At least a pair of apertures is thus provided in the second piezoelectric layer. Step 116 may include providing a mask that exposes the regions of the second piezoelectric layer to be removed to form the apertures, then etching the second piezoelectric layer to form the apertures. For example, RIE having the appropriate chemistry for the selected piezoelectric layer may be used. Alternatively, ion milling, wet etching or other techniques might be used. Thus, the apertures are formed using photolithographic techniques. One of the apertures formed in step 116 exposes the portion of the first conductive plug that has already been fabricated. Another aperture exposes a portion of the second conductive layer. The portion of the second conductive layer that is exposed may be distal from the first conductive plug. For example, the portion of the second conductive layer that is exposed (and in which a second conductive plug is to be formed) may be fifty through one hundred microns from the first conductive plug. In some embodiments, the distance between the first and second conductive plugs is greater than or equal to two to three times the thickness of a piezoelectric layer.

Portions of the first conductive plug and the second conductive plug are provided in the apertures, via step 118. Thus, the first conductive plug continues to be fabricated. The second conductive plug makes electrical contact to the second conductive layer. Step 118 may include depositing a seed layer, then plating a conductive material such as Au, Ni, NiFe and/or Cu in the apertures. Because it is plated or deposited in an analogous manner, the conductive material may fill the apertures in the second piezoelectric layer. Step 118 may also include removing the seed layer and/or other conductive materials that reside outside of the aperture. For example, an ion mill may be used to remove the seed layer. A CMP may be performed to remove the part of the conductive material outside of the apertures and provide a substantially flat surface of the second piezoelectric layer. The first conductive plug being formed is, therefore, electrically connected to the first conductive layer but electrically insulated from the second conductive layer. The second conductive plug is electrically connected to the second conductive layer, but electrically insulated from the first conductive layer.

A third conductive layer is deposited, via step 120. The third conductive layer is to be electrically coupled to the first conductive plug, but electrically insulated from the second plug. Thus, a part of the third conductive layer is removed to form an aperture therein, via step 122. The aperture exposes the second conductive plug and, in some embodiments, a region of the second piezoelectric layer around the second conductive plug. Thus, the aperture allows the third conductive layer to be insulated from the second conductive plug.

Figure 3:
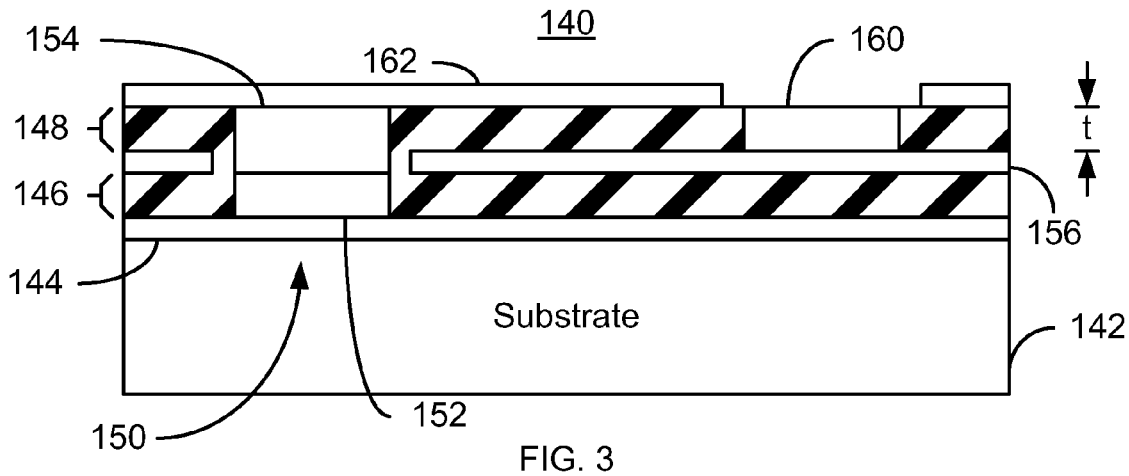
FIG. 3 is a diagram depicting an exemplary embodiment of a piezoelectric multilayer.

FIG. 3 is a diagram depicting an exemplary embodiment of a piezoelectric multilayer 140 fabricated using the method 100. FIG. 3 is not to scale. For clarity, only portions of the piezoelectric multilayer 140 are shown. The piezoelectric multilayer 140 is provided on substrate 142. The piezoelectric multilayer shown includes first conductive layer 144 provided in step 102 and piezoelectric layers 146 and 148 provided in steps 104 and 114. Conductive layers 156 and 162 deposited in steps 110 and 120 are also shown. In addition, first conductive plug 150 and second conductive plug 160 are shown. The first conductive plug 150 includes portions 152 and 154 formed in steps 108 and 118, respectively. The second conductive plug 160 shown only includes a single portion also formed in step 118. As can be seen in FIG. 3, the conductive layers 144 and 162 are electrically connected through the conductive plug 150. The second conductive layer 156 is electrically isolated from the conductive layers 144 and 162.

Thus, a piezoelectric multilayer 140 having two piezoelectric layers may be formed. The method 100 may be continued by repeating some portion of steps 108-122 to provide additional piezoelectric layers and conductive layers (not shown in FIG. 3). Alternating conductive layers 144 and 162 alternating layers 156 and any similar layers (not shown) are electrically coupled either through the first plug 150 or through the second plug 160. Connection may also be made to the piezoelectric multilayer 140 from external device(s). Thus, a piezoelectric multilayer 140 having the desired number of piezoelectric layers may be formed. For example, in some embodiments, three, four, five, or potentially more layers of piezoelectric material may be used. Electrical connection may be made to the desired conductive layers 144 and 162 or 156 within the piezoelectric multilayer 140 generally without regard to the number of piezoelectric layers 146 and 148. Further, the thicknesses of the individual piezoelectric layers 146 and 148 may be controlled. Fabrication of such multilayers is also simplified and made more reliable for thinner piezoelectric layers 144 and 146. For example, piezoelectric layers 144 and 146 having a thickness, t, of less than one micron may be used in the piezoelectric multilayer. Note that although the thicknesses of the layers 146 and 148 are shown as the same, the thicknesses may be different. Similarly, different piezoelectric materials may be used for the layers 146 and 148.

Thus, using the method 100, a piezoelectric multilayer 140 having the desired geometry may be fabricated. More specifically, because photolithographic techniques are used in each layer, connections to alternating plates, the thickness of the piezoelectric layers, the filling of the apertures in layers and other features may be well controlled by reliable processes. In addition, fabrication is modular in nature. Thus, repetition of specific processes allows a multilayer having an increased number of layers without unduly complicating fabrication. Further, because a multilayer 140 is formed, the response of the piezoelectric multilayer 140 is improved over a single layer of piezoelectric. Thus, fabrication, performance, and reliability may be improved.

Figure 4:
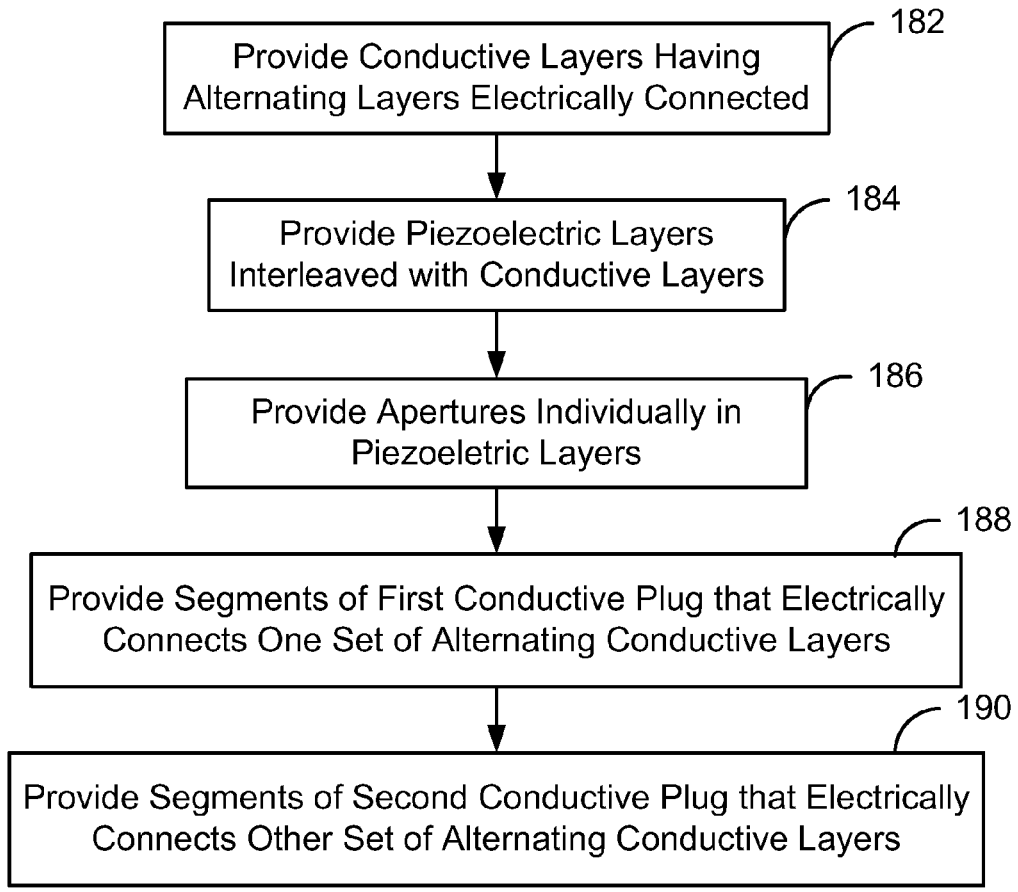
FIG. 4 is a flow chart depicting another exemplary embodiment of a method for fabricating a piezoelectric multilayer.

FIG. 4 is a flow chart depicting an exemplary embodiment of a method 180 for fabricating a piezoelectric multilayer. The method 180 is described in the context of a particular piezoelectric multilayer 140, though other multilayers might be so fabricated. For simplicity, some steps may be omitted and/or combined. The piezoelectric multilayer being fabricated may be used in a disk drive. The method 100 is also described in the context of providing a single piezoelectric multilayer 140 and its associated structures. However, the method 180 may be used to fabricate multiple piezoelectric multilayers at substantially the same time. The method 180 and system are also described in the context of particular layers. However, in some embodiments, such layers may include multiple sub-layers. In one embodiment, the method 180 commences after formation of the underlayer(s) or other structures on the substrate on which the piezoelectric multilayer is to reside.

The conductive layers 144, 156, and 162 for the piezoelectric multilayer 140 are provided, via step 182. The conductive layers 144, 156, and 162 may be considered to be separated into a first plurality of alternating layers 144 and 162 and a second plurality of alternating layers 156. The first and second pluralities of alternating conductive layers are interleaved. The alternating layers 144 and 162 of the first portion of conductive layers are all electrically connected. Similarly, the alternating layers 156 of the second portion of the alternating layers are also electrically connected. The first plurality of the conductive layers 144 and 162 are electrically isolated from the second plurality of the conductive layers 156.

Piezoelectric layers 146 and 148 interleaved with the conductive layers are provided, via step 184. Steps 182 and 184 may thus include alternately depositing the piezoelectric layers 146 and 148 and the conductive layers 144, 156, and 162.

Apertures are individually provided in the piezoelectric layers 146 and 148, via step 186. In some embodiments, step 1086 is provided immediately after step 184. Thus, the conductive layers 144, 156 and 162; piezoelectric layers 146 and 148; and apertures within the piezoelectric layers 146 and 148 may be alternately provided.

A first conductive plug 150 that electrically connects the first plurality of alternating conductive layers 144 and 162 is provided, via step 188. The first conductive plug includes segments 152 and 154 in a first portion of the apertures in the piezoelectric layers 146 and 148. Each segment extends through one of the piezoelectric layers 146 and 148. Stated differently, the first conductive plug 150 is built in segments 152 and 154, with each segment 152 and 154 filling an aperture one of the piezoelectric layers 146 and 148. The segments 152 and 154 overlap and contact the first plurality of alternating conductive layers 144 and 162. Thus, the segments form the first conductive plug that electrically connects the first alternating conductive layers.

A second conductive plug 160 that electrically connects the second plurality of alternating conductive layers 156 is provided, via step 190. The second conductive plug 160 includes segments 160 in a second portion of the apertures in the piezoelectric layers 148. The segment 160 extends through one piezoelectric layer 148. In step 190, therefore, the second conductive plug 160 is built in segments, with each segment filling an aperture one of the piezoelectric layers. The segments 160 overlap and contact the second plurality of alternating conductive layers. Thus, the segments form the second conductive plug that electrically connects the second alternating conductive layers. Using the method 180, the piezoelectric multilayer 140 may be fabricated. Consequently, the method 180 may share many if not all of the benefits of the method 100.

Figure 5:
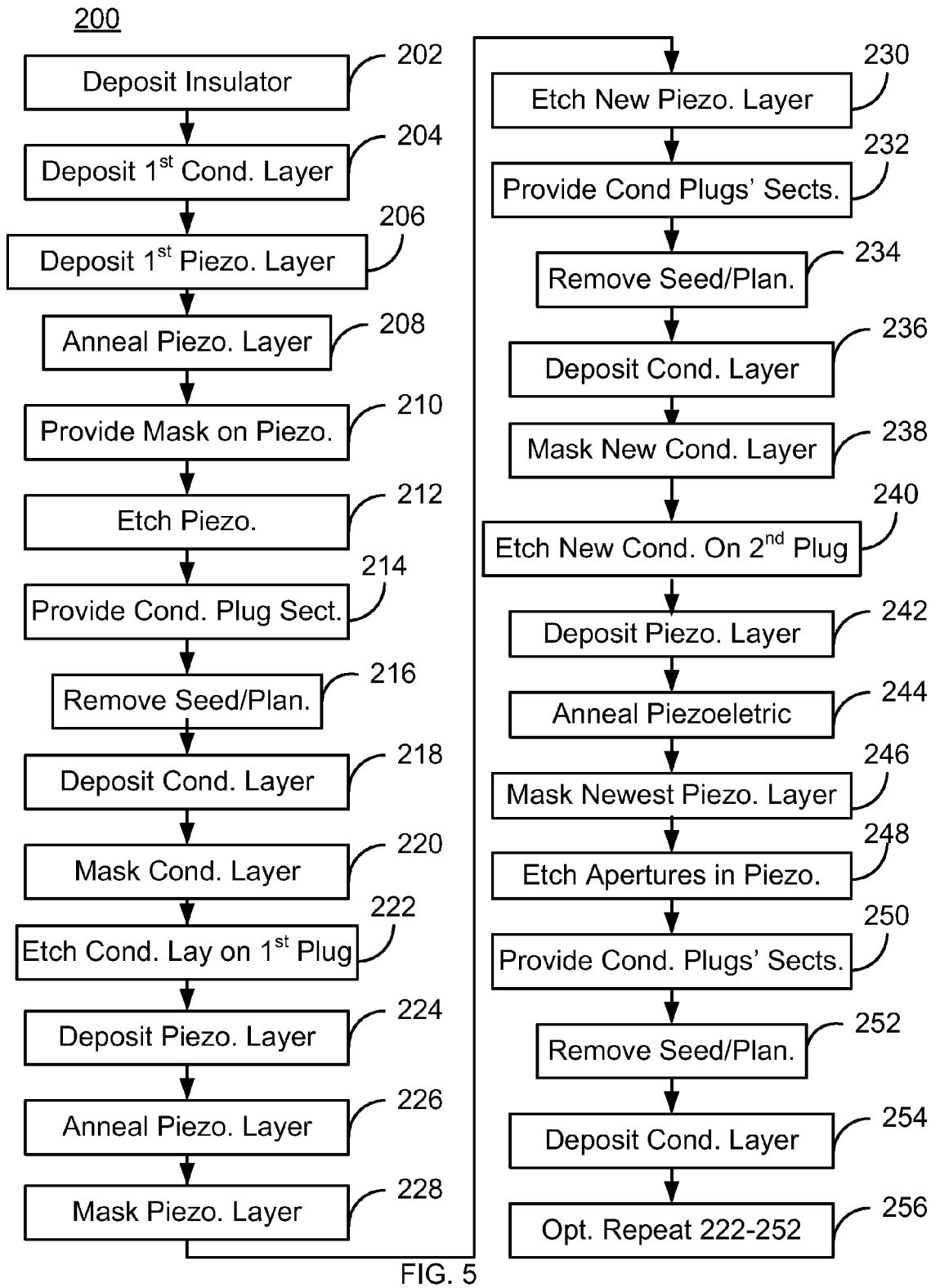
FIG. 5 is a flow chart depicting another exemplary embodiment of a method for fabricating a piezoelectric multilayer.

FIG. 5 is a flow chart depicting another exemplary embodiment of a method 200 for fabricating a piezoelectric multilayer. For simplicity, some steps may be omitted and/or combined. FIGS. 6-22 are diagrams depicting an exemplary embodiment of a piezoelectric multilayer 300 during fabrication using the method 200. For simplicity, FIGS. 6-22 are not to scale. The method 200 is described in the context of a particular piezoelectric multilayer 300, though other multilayers might be so fabricated. The piezoelectric multilayer 300 being fabricated may be used in a disk drive and/or other device. The method 200 is also described in the context of providing a single piezoelectric multilayer 300 and its associated structures. However, the method 200 may be used to fabricate multiple piezoelectric multilayers at substantially the same time. The method 200 and system are also described in the context of particular layers. However, in some embodiments, such layers may include multiple sub-layers. In one embodiment, the method 200 commences after formation of the underlayer(s) or other structures on the substrate on which the piezoelectric multilayer is to reside.

An insulator such as $SiO_2$, $Si_3N_4$, $Al_2O_3$, and/or another insulator is deposited on the substrate, via step 202. The insulator may prevent shorting of the piezoelectric multilayer through the substrate. A first conductive layer is deposited on the insulator, via step 204. The conductive layer could be, for example, a Ti/Pt bilayer or other conductive material(s). Steps 202 and 204 are thus analogous to the step 102 of the method 100.

A first piezoelectric layer is deposited on the first conductive layer, via step 206 and annealed, via step 208. Steps 206 and 208 are analogous to step 104. Step 208 anneals the material to achieve the desired crystal structure of the piezoelectric layer. Thus, the materials used in the piezoelectric multilayer 300 are generally desired to withstand such anneals. Further, the thickness of the piezoelectric layer may depend upon the application. In some embodiments, the piezoelectric layer may be less than or equal to one micron thick. In addition, the thickness of the piezoelectric layer as deposited may be somewhat higher than the desired thickness to account for planarization.

Figure 6:
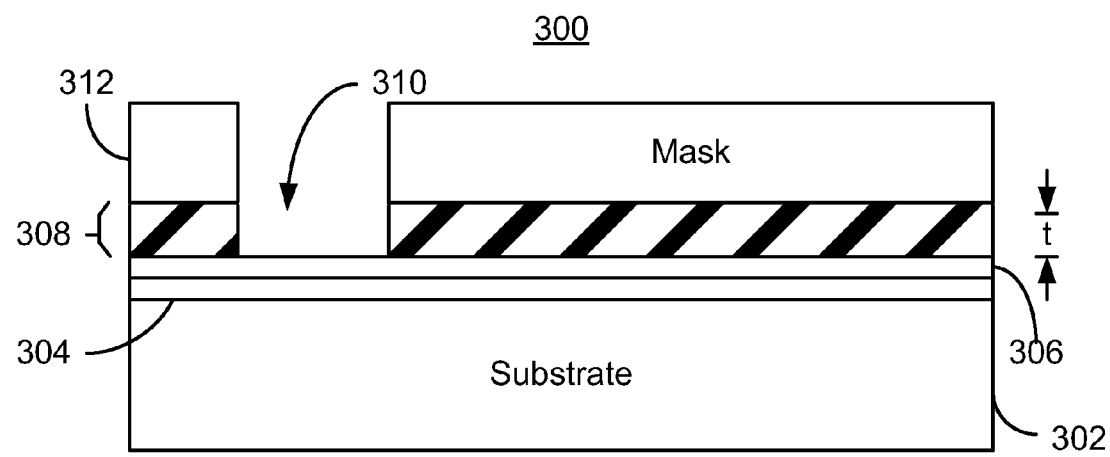
FIGS. 6-22 are diagrams depicting an exemplary embodiment of a piezoelectric multilayer during fabrication.

A mask is provided on the piezoelectric layer, via step 210. Photolithography may be used to provide the mask in step 210. The mask includes at least one aperture and may be formed of photoresist or another material. Thus, a part of the piezoelectric layer is exposed. An RIE is performed to etch the exposed part of the piezoelectric layer, via step 212. Alternatively, ion milling, wet etching or other techniques might be used. Steps 210 and 212 may thus be used to form an aperture in which a conductive plug is formed. Steps 210 and 212 may be analogous to the step 106 of the method 100. FIG. 6 depicts the piezoelectric multilayer 300 after step 210 is performed. Thus, a substrate 302 is shown. Insulating layer 304 and conductive layer 306 formed in steps 202 and 204, respectively are shown. A piezoelectric layer 308 is shown with mask 312. An aperture 310 has been formed in the piezoelectric layer 308.

Figure 7:
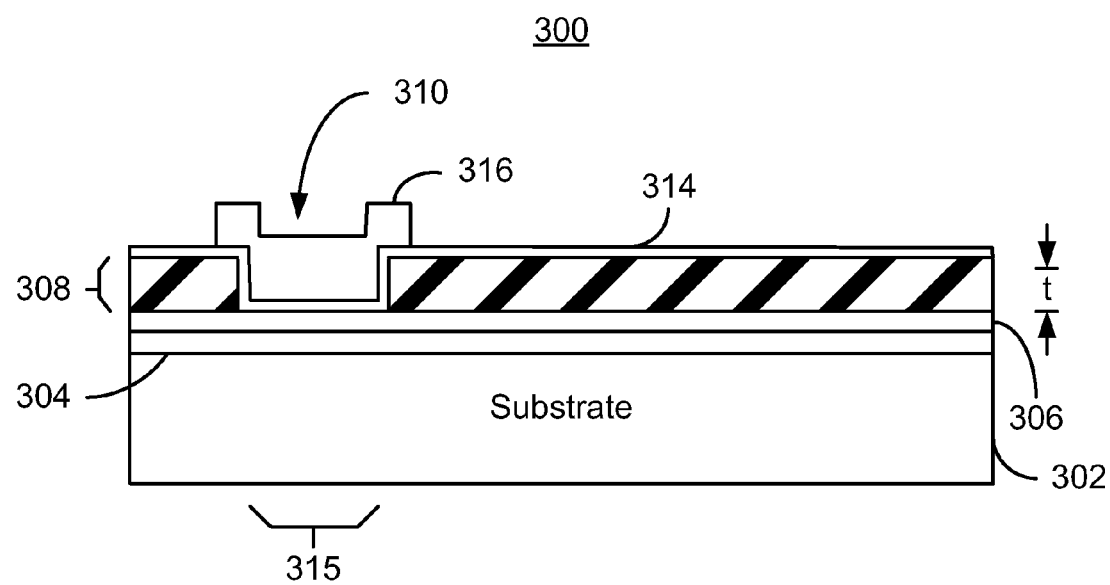
Figure 8:
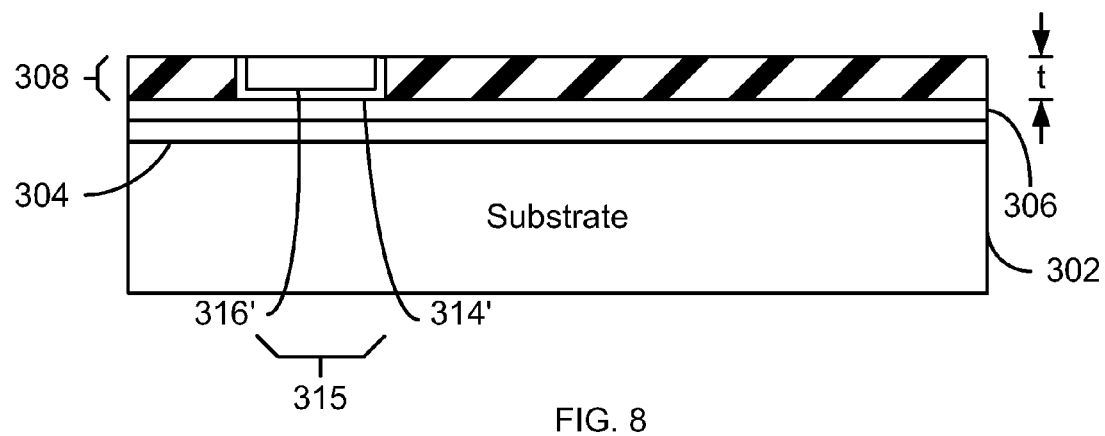

A portion of a first conductive plug is provided within the first aperture, via step 214. Step 214 may include depositing a seed layer, then plating a conductive material such as Au, Ni, NiFe and/or Cu. FIG. 7 depicts the piezoelectric multilayer 300 after step 214 is completed. Thus, seed layer 314 and plug 315 having section 316 are shown. The first conductive plug 315 being formed is, therefore, electrically connected to the first conductive layer 306. The seed layer 314 outside of the aperture 310 may be removed and the device planarized, via step 216. Thus, steps 214 and 216 may correspond to step 108 of the method 100. FIG. 8 depicts the piezoelectric multilayer 300 after step 216 is completed. Consequently, plug section 316' and seed layer 314' remain. In addition, the piezoelectric multilayer 300 has a flat surface. Further, the thickness of the piezoelectric layer 308 has been reduced to substantially its desired level.

Figure 9:
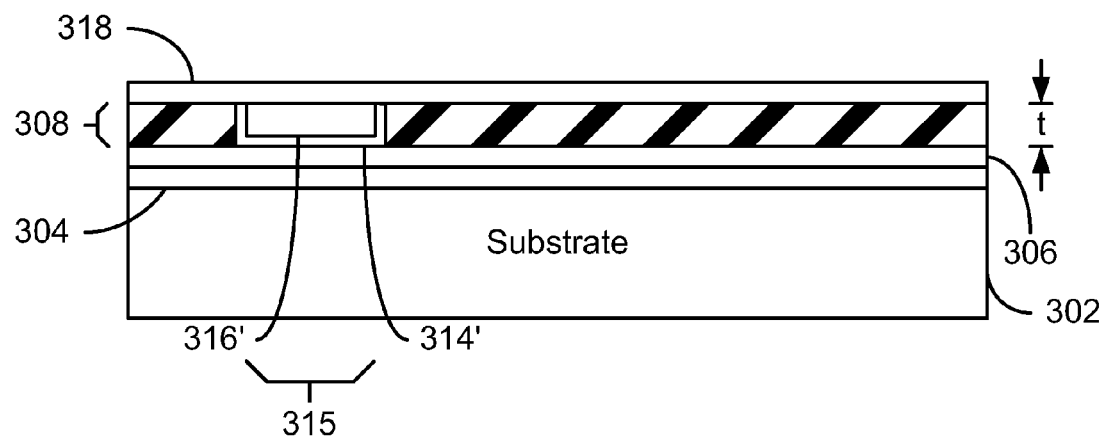

A second conductive layer is deposited on the first piezoelectric layer, via step 218. Step 218 is analogous to step 110 of the method 100. FIG. 9 depicts the piezoelectric multilayer 300 after step 218 is performed. Thus, conductive layer 318 is present.

Figure 10:
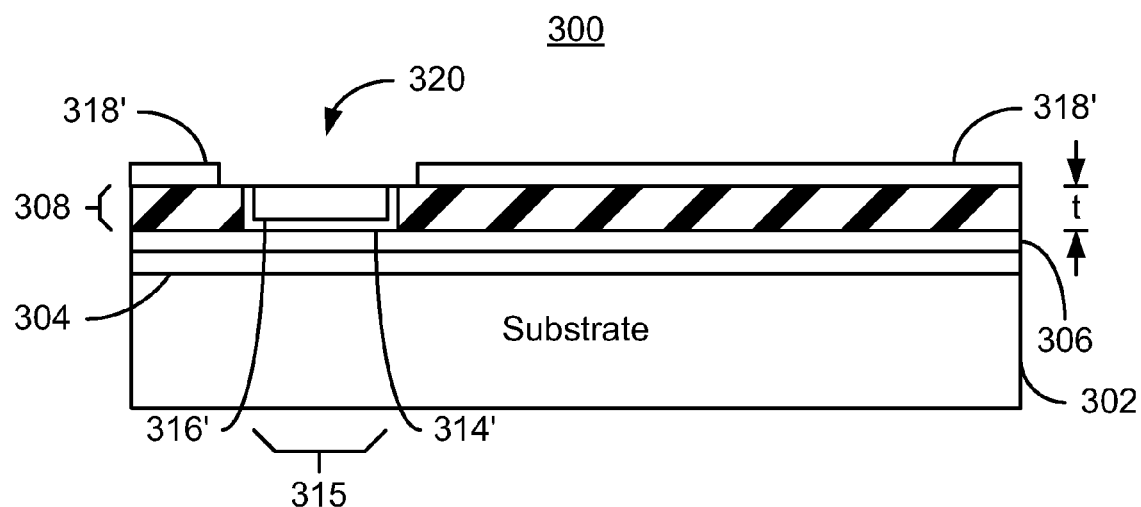

The second conductive layer is desired to be electrically isolated from the first conductive layer. Thus, the conductive layer is masked, via step 220. Step 220 may employ photolithographic techniques. The mask includes an aperture above the position of the first conductive plug 315. The mask may be a photoresist or other mask. The conductive layer 318 is then etched, via step 222. Steps 220 and 222 thus correspond to step 112 of the method 100. FIG. 10 depicts the piezoelectric multilayer 300 after step 222 is performed. Thus, aperture 320 is provided in the conductive layer 318'. The aperture 320 is aligned with and exposes the first conductive plug 315. The aperture 320 may also be wider than the first conductive plug 315, allowing the conductive layer 318' to be electrically isolated from the first conductive plug 315.

Figure 11:
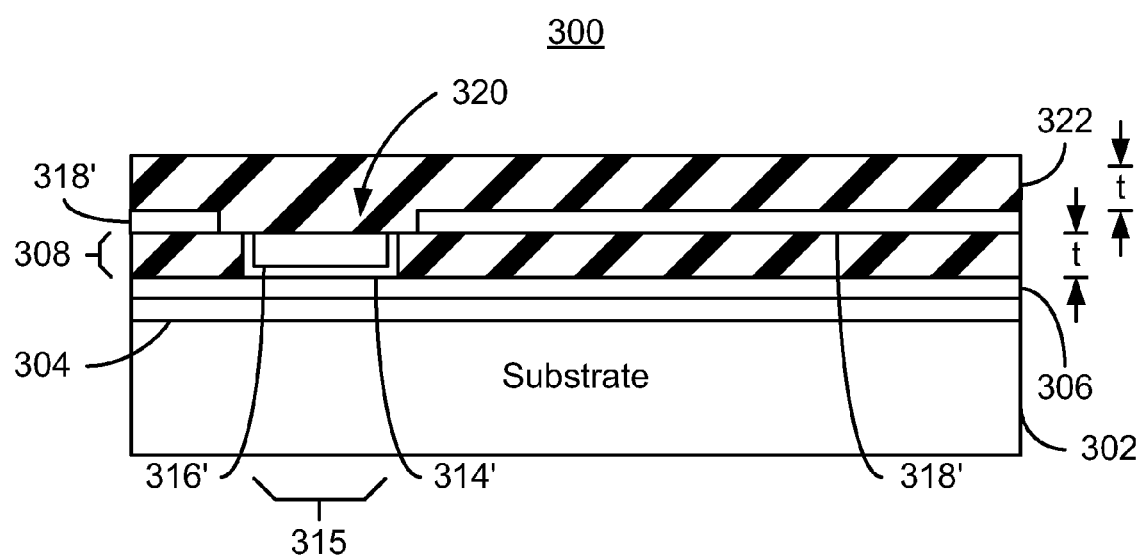

Another piezoelectric layer is deposited, via step 224. The piezoelectric layer is also annealed, via step 226. Steps 224 and 226 may thus correspond to step 114 of the method 100. FIG. 11 depicts the piezoelectric multilayer 300 after step 226 is performed. Thus, another piezoelectric layer 322 is shown. The second piezoelectric layer 322 is insulating, covers the first conductive plug 315 and covers the second conductive layer 318'. Because the aperture 320 may have a larger footprint than the first conductive plug 315, the piezoelectric layer 322 may also overlap a portion of the piezoelectric layer 308 around the first conductive plug. In some embodiments, the thickness of the second piezoelectric layer provided in step 114 may be greater than the desired thickness, t, to account for the CMP, described below.

Figure 12:
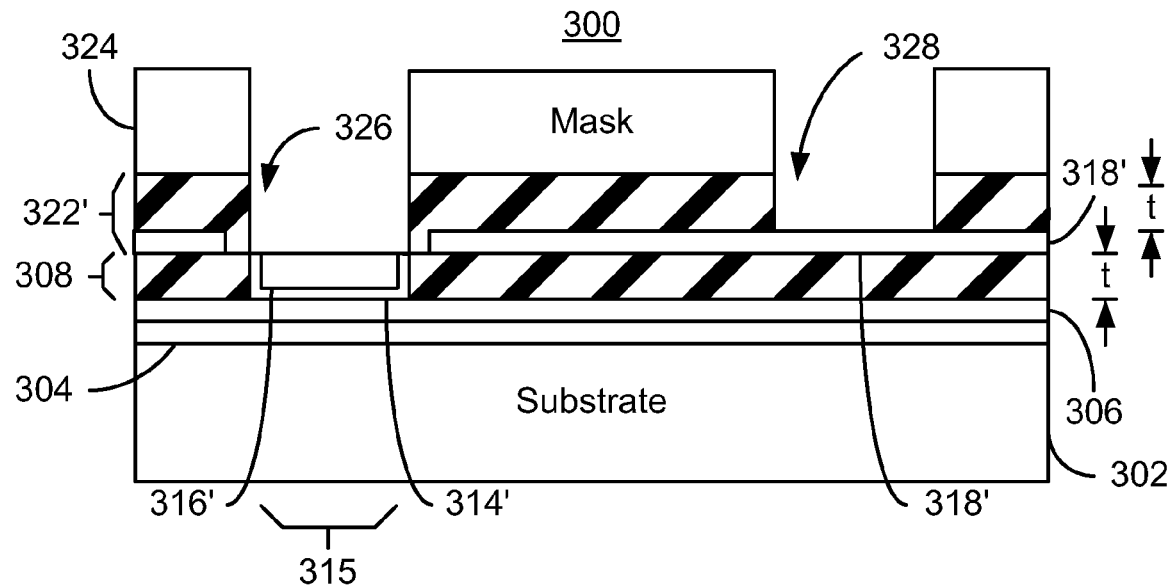

The piezoelectric layer 322 is masked, via step 228. The mask exposes a portion of the piezoelectric layer 322 above the first conductive plug 315. Again, the mask may be a photoresist or other mask. In addition, a region of the piezoelectric layer 322 in which the second conductive plug is to be formed is exposed. This region may be distal from the first conductive plug 315. Step 228 may be performed using photolithographic techniques. The piezoelectric layer 322 is etched, for example using an RIE, via step 230. Alternatively, ion milling, wet etching or other techniques might be used. Steps 228 and 230 thus correspond to step 116 of the method 100. FIG. 12 depicts the piezoelectric multilayer after step 230 is performed. Thus, apertures 326 and 328 are formed in the piezoelectric layer 322' using mask 324. Aperture 326 exposes a portion of the first conductive plug 315. Another aperture 326 exposes a portion of the second conductive layer 318'.

Figure 13:
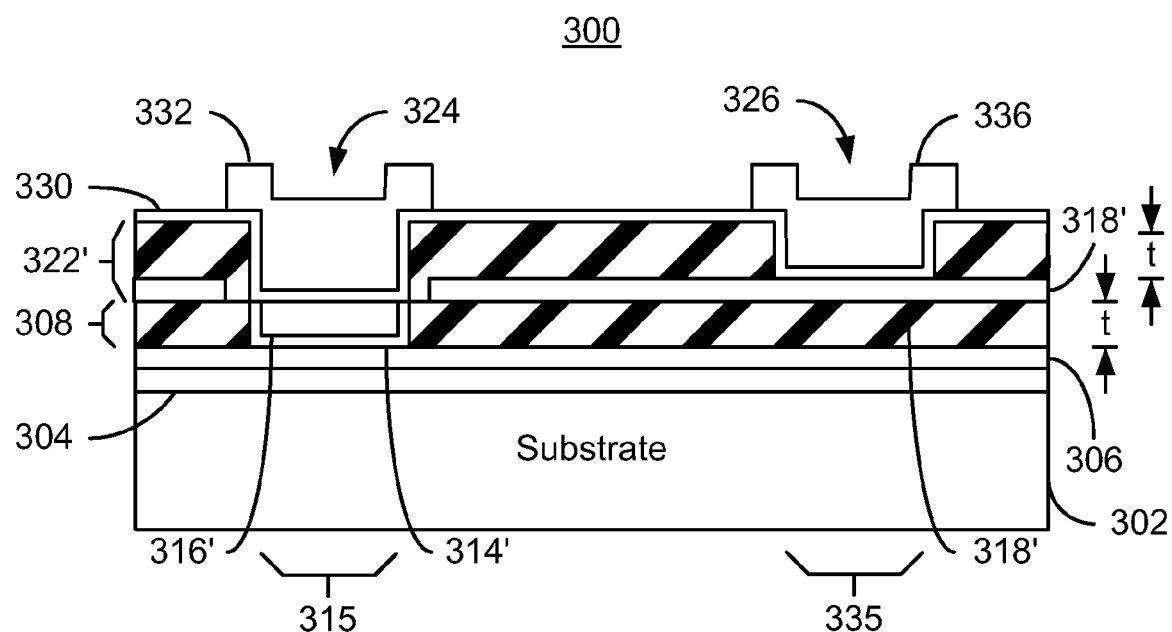

Portions of the first conductive plug and the second conductive plug are provided in the apertures, via step 232. Step 232 may include depositing a seed layer, then plating a conductive material such as Au, Ni, NiFe and/or Cu in the apertures. Because it is plated or deposited in an analogous manner, the conductive material may fill the apertures in the second piezoelectric layer. FIG. 13 depicts the piezoelectric multilayer 300 after step 232 is performed. Thus, seed layer 330 and section 332 of the first conductive plug 315 are shown. Similarly, section 336 of the second conductive plug 335 is shown.

Figure 14:
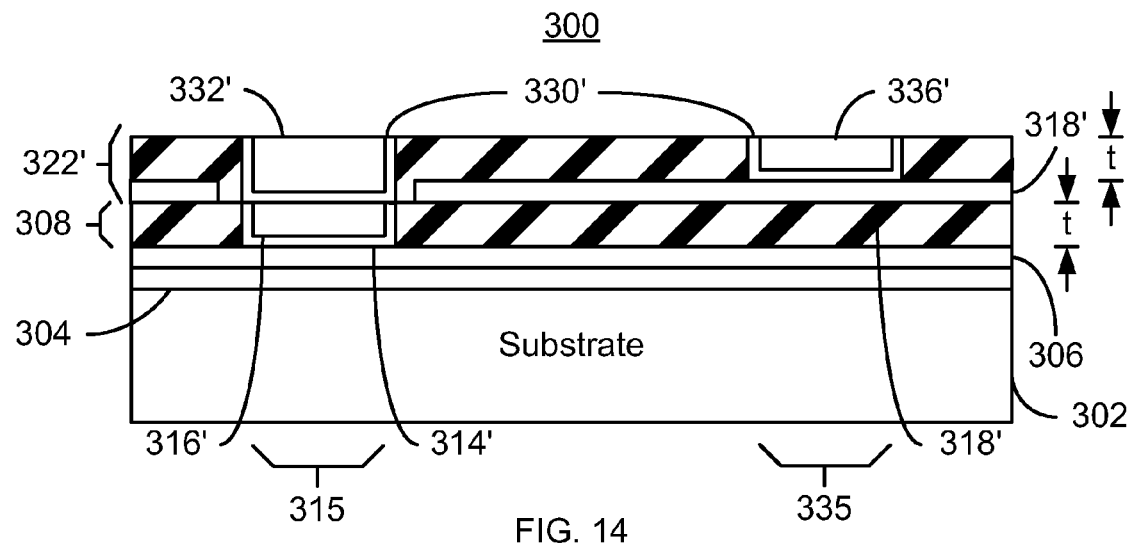

A part of the seed layer 330 and/or other conductive materials of sections 332 and 336 that reside outside of the aperture are removed, via step 234. Steps 232 and 234 may thus be considered to be analogous to step 118 of the method 100. For example, an ion mill may be used to remove the seed layer. A CMP may be performed to remove the part of the conductive material outside of the aperture and provide a substantially flat surface of the first piezoelectric layer. FIG. 14 depicts the piezoelectric multilayer 300 after step 234 is completed. Thus, parts of the seed layer 330' and sections 332' and 336' outside of the apertures have been removed. Thus, the first conductive plug 315 includes sections 316' and 332', as well as seed layers 314' and 330'. The second conductive plug 335 includes section 336' and seed layer 330'. The first conductive plug 315 is electrically connected to the first conductive layer 306 but electrically insulated from the second conductive layer 318'. The second conductive plug 335 is electrically connected to the second conductive layer 318', but electrically insulated from the first conductive layer 306.

Figure 15:
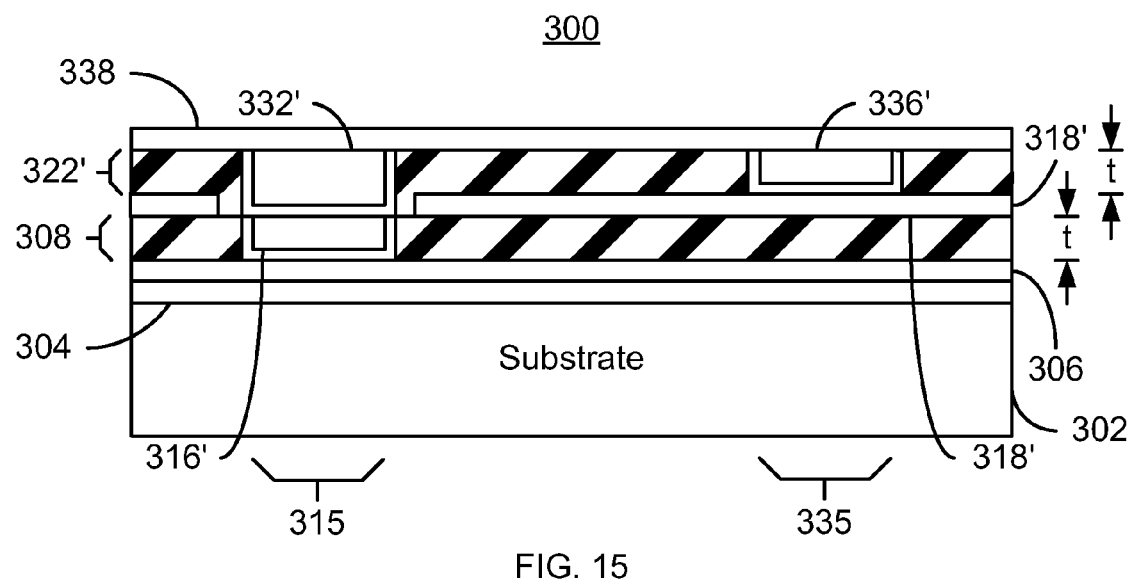

A conductive layer is deposited, via step 236. Step 236 is analogous to step 120 of the method 100. FIG. 15 depicts the piezoelectric multilayer after step 236 is performed. A third conductive layer 338 is thus shown. The third conductive layer 336 is electrically coupled to the first conductive plug 315, but electrically insulated from the second plug 335.

Figure 16:
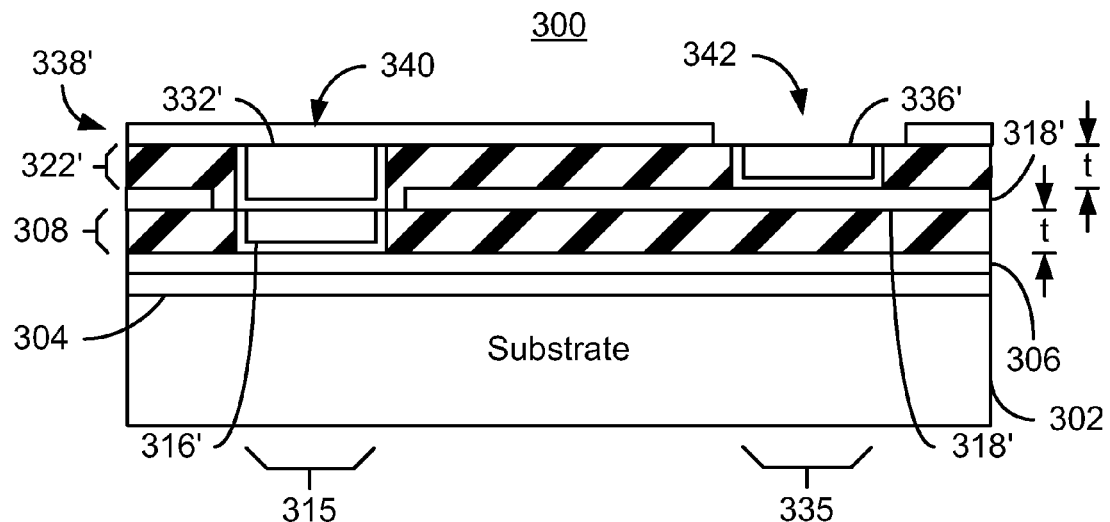

The conductive layer 338 is masked, via step 238. Step 238 may employ photolithographic techniques. The mask includes an aperture above the position of the second conductive plug 335 and may include photoresist or other materials. The conductive layer 338 is then etched, via step 240. Steps 238 and 240 are thus similar to step 112 of the method 100. FIG. 16 depicts the piezoelectric multilayer 300 after step 240 is performed. Thus, aperture 342 has been formed in the conductive layer 338' using photolithographic techniques.

Figure 17:
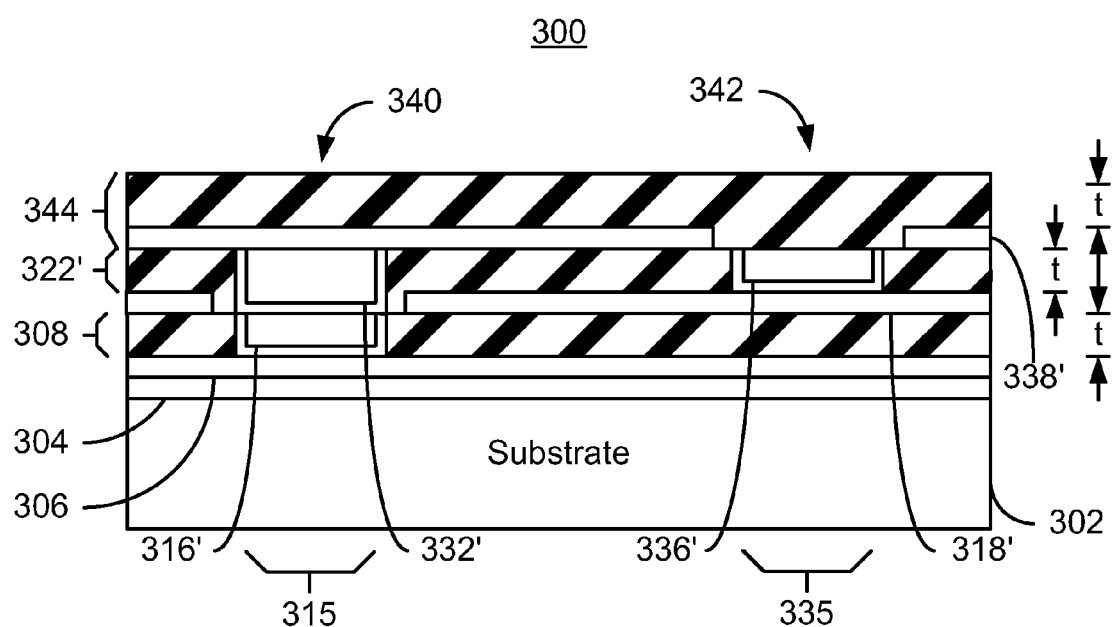

Another piezoelectric layer is deposited, via step 242. The piezoelectric layer is also annealed, via step 244. Steps 242 and 244 may thus be similar to step 114 of the method 100. FIG. 17 depicts the piezoelectric multilayer 300 after step 244 is performed. Thus, another piezoelectric layer 344 is shown. The piezoelectric layer 344 is insulating, covers the first conductive plug 315 and covers the conductive layer 338'. Because the aperture 342 may have a larger footprint than the first conductive plug 315, the piezoelectric layer 344 may also overlap a portion of the piezoelectric layer 322' around the second conductive plug 335. In some embodiments, the thickness of the piezoelectric layer 344 provided in step 242 may be greater than the desired thickness, t, to account for the CMP, described below.

Figure 18:
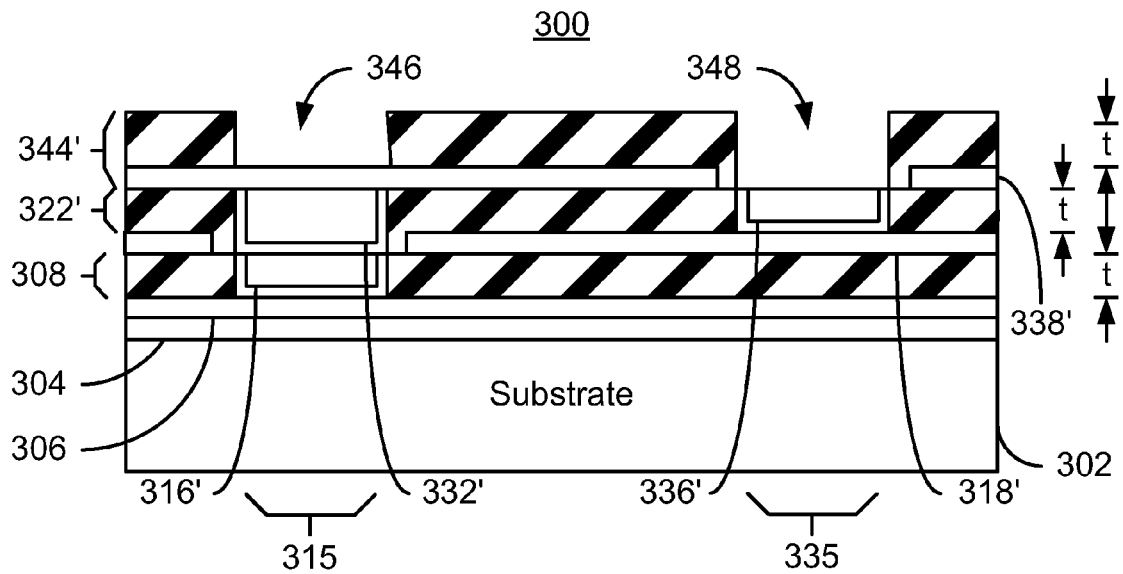

The piezoelectric layer 344 is masked, via step 246. The mask exposes parts of the piezoelectric layer 344 above the first conductive plug 315 and the second conductive plug 335. Step 246 may be performed using photolithographic techniques. The mask used may thus be photoresist or another material. The piezoelectric layer 344 is etched, for example using an RIE, via step 248. Steps 246 and 248 may thus be similar to step 116 of the method 100. FIG. 18 depicts the piezoelectric multilayer 300 after step 248 is performed. Thus, apertures 346 and 348 are formed in the piezoelectric layer 344'. Aperture 346 exposes a portion of the first conductive plug 315. Another aperture 346 exposes a portion of the second conductive plug 335.

Figure 19:
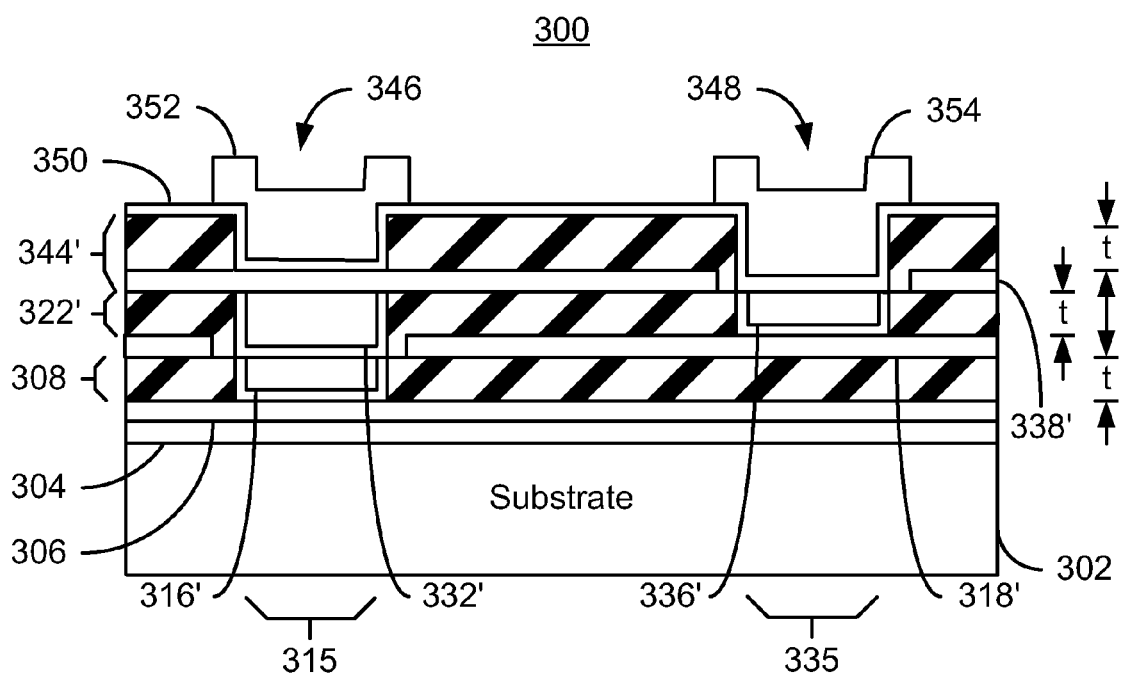

Portions of the first conductive plug and the second conductive plug are provided in the apertures, via step 250. Step 250 is analogous to steps 218 and 236. FIG. 19 depicts the piezoelectric multilayer 300 after step 250 is performed. Thus, seed layer 350, section 352 of the first conductive plug 315, and the second 354 of the second conductive plug 336, respectively, are shown.

Figure 20:
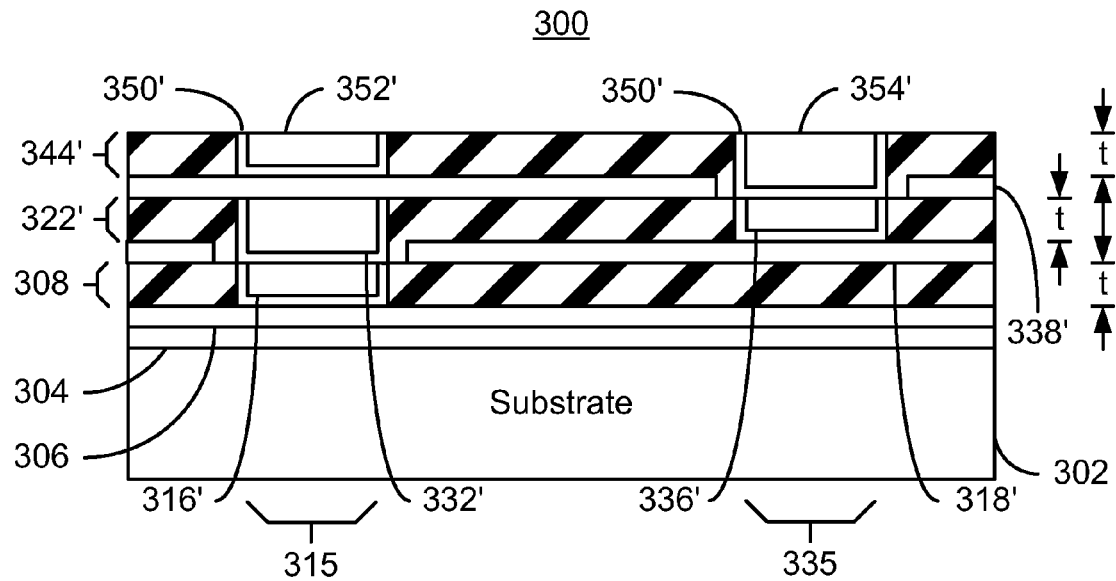

A part of the seed layer 350 and/or other conductive materials of sections 352 and 354 that reside outside of the aperture are removed, via step 252. Steps 250 and 252 may thus be considered to be similar to step 118 of the method 100. FIG. 20 depicts the piezoelectric multilayer 300 after step 252 is completed. Thus, parts of the seed layer 350' and sections 352' and 354' outside of the apertures have been removed. Thus, the first conductive plug 315 includes sections 316', 332', and 352' as well as seed layers 314', 330', and 350'. The second conductive plug 335 includes sections 336' and 354' as well as seed layers 330' and 350'. The first conductive plug 315 is electrically connected to the first conductive layer 306 but electrically insulated from the second conductive layer 3'. The second conductive plug 335 is electrically connected to the second conductive layer 318', but electrically insulated from the first conductive layer 310.

Figure 21:
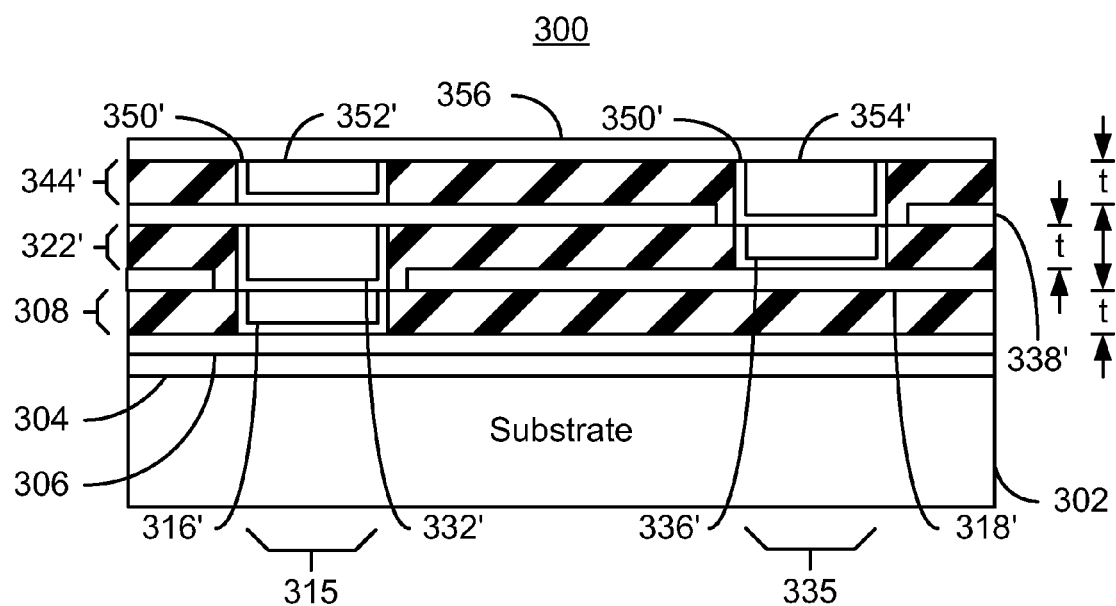
Figure 22:
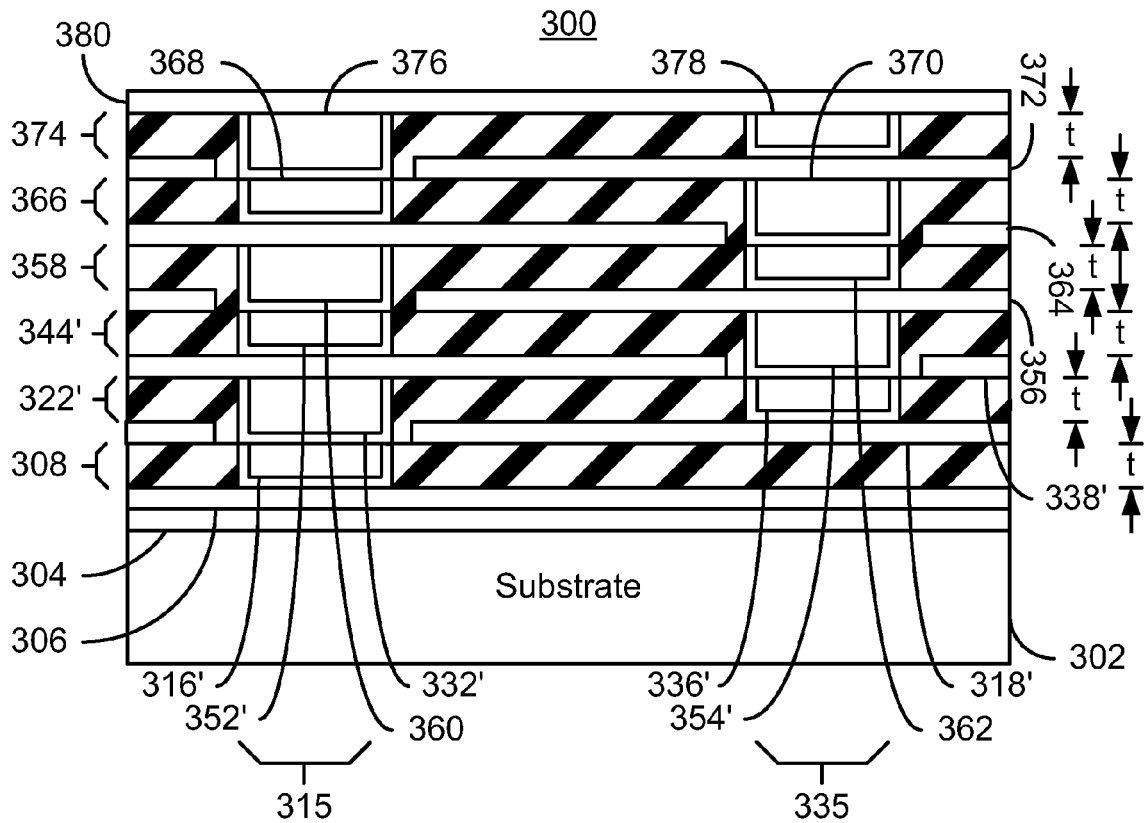

A conductive layer may be deposited, via step 254. FIG. 21 depicts the piezoelectric multilayer after step 254 is performed. Thus, an additional conductive layer 356 is shown. Some portions of steps 222-252 may then be repeated to obtain the desired performance of the piezoelectric multilayer 220, via step 256. Thus, the desired number of repeats of the piezoelectric layers may be achieved. FIG. 22 depicts the piezoelectric multilayer 300 after step 254 is provided. In the embodiment shown, six layers of piezoelectric material have been used. However, in other embodiments, another number may be used. Thus, piezoelectric layers 358, 366, and 374 interleaved with conductive layers 364, 372, and 380. Further, portions 360, 368, and 376 of the first conductive plug 315 have been provided. Similarly, portions 362, 370, and 378 of the second conductive plug 335 have been provided.

Using the method 200, the piezoelectric multilayer 300 may be fabricated. Thus, the benefits of a high response, more easily and repeatably manufactured, thin piezoelectric multilayer 300 having the desired number of layers may be provided.

Figure 23:
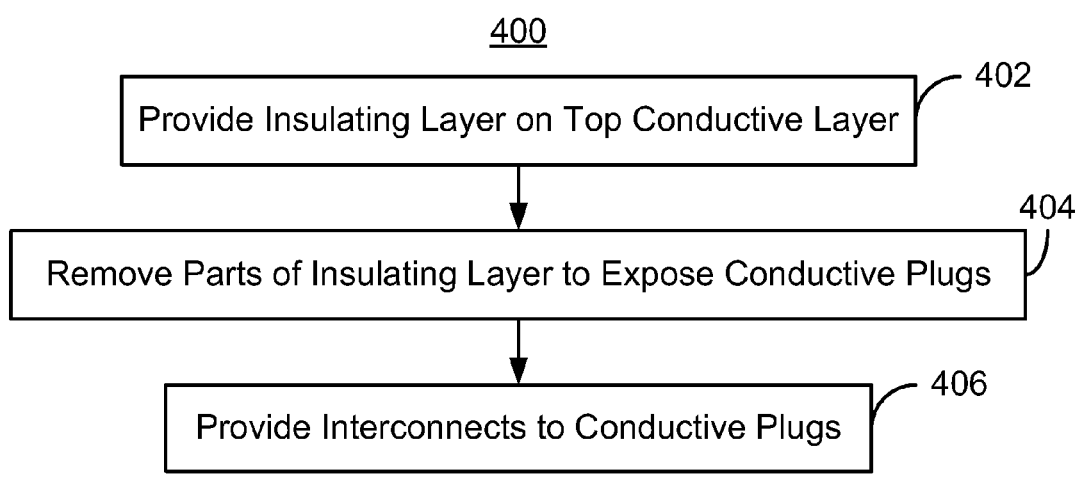
FIG. 23 is a flow chart depicting another exemplary embodiment of a method for providing electrical contact to a piezoelectric multilayer.

FIG. 23 is a flow chart depicting another exemplary embodiment of a method 400 for providing contacts to a piezoelectric multilayer. For simplicity, some steps may be omitted and/or combined. The method 400 is described in the context of a particular piezoelectric multilayer 300, though other multilayers might be so fabricated. The piezoelectric multilayer 300 being fabricated may be used in a disk drive and/or other device. The method 400 is also described in the context of providing a single piezoelectric multilayer 400 and its associated structures. However, the method 400 may be used to fabricate multiple piezoelectric multilayers at substantially the same time. The method 400 and system are also described in the context of particular layers. However, in some embodiments, such layers may include multiple sublayers. In one embodiment, the method 200 commences after formation of the underlayer(s) or other structures on the substrate on which the piezoelectric multilayer is to reside. The method 400 may be used to form top contacts on a piezoelectric multilayer.

An insulating layer is deposited on the top conductor of the piezoelectric multilayer 300, via step 402. The thickness and composition of the insulator may be chosen based on various factors relevant to the application in which the piezoelectric multilayer is to be used. In addition to electrically insulating the piezoelectric multilayer 300, the composition, thickness and other properties of the insulator may be selected to reduce residual stress in the multilayer or perform other functions.

Parts of the insulating layer may be removed to expose the first conductive plug and the second conductive plug, via step 404. Step 404 is generally performed using photolithography. Interconnects may then be provided to the first conductive plug and the second conductive plug from the top of the piezoelectric multilayer, via step 406.

Figure 24:
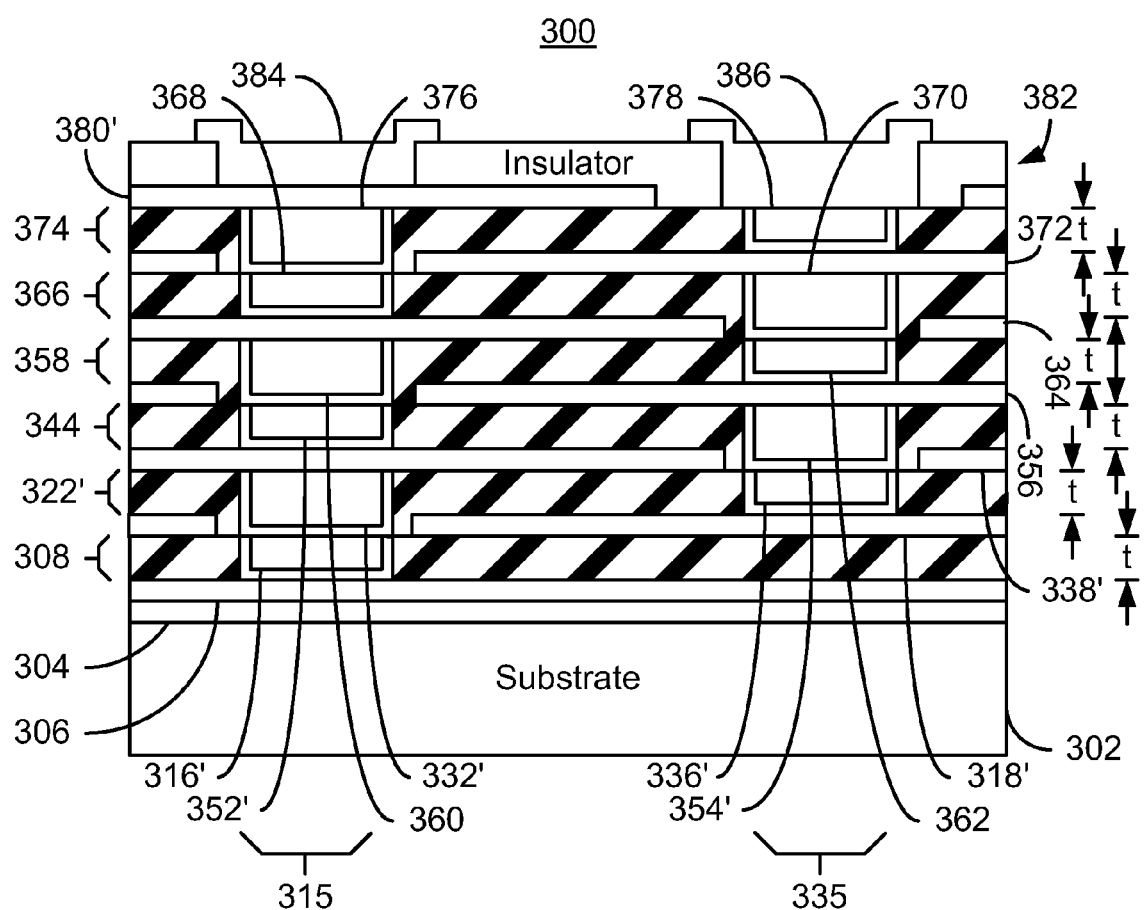
FIG. 24 is a diagram depicting an exemplary embodiment of a piezoelectric multilayer.

FIG. 24 is a diagram depicting an exemplary embodiment of a piezoelectric multilayer 300 including top contacts. For simplicity, the piezoelectric multilayer 300 is used. However, in another embodiment, another piezoelectric multilayer might be used. For simplicity, FIG. 24 is not to scale. Thus, in addition to structure previously described, an aperture has been provided in the top conductive layer 380'. Thus, the top portion 378 of the conductive plug 335 is exposed. An insulator 382 resides on the top conductor 380'. Apertures have been provided in the insulator 382 using step 404 of the method. Interconnects 384 and 386 connect to the conductive plugs 315 and 335, respectively.

Using the method 400 and the piezoelectric multilayer 300 shown in FIG. 24, electrical connection may be made to the piezoelectric multilayer 300. Thus, the piezoelectric multilayer may be incorporated into a device and operated. The benefits of the piezoelectric multilayer 300 may thus be exploited.

Figure 25:
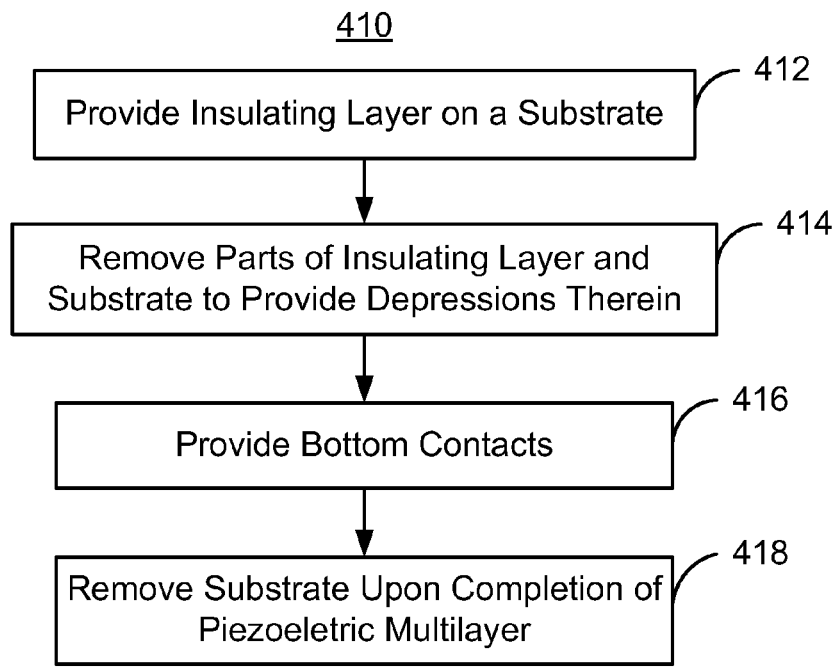
FIG. 25 is a flow chart depicting another exemplary embodiment of a method for providing electrical contact to a piezoelectric multilayer.

FIG. 25 is a flow chart depicting another exemplary embodiment of a method 410 for providing bottom contacts for a piezoelectric multilayer. For simplicity, some steps may be omitted and/or combined. FIGS. 26-31 are diagrams depicting an exemplary embodiment of a piezoelectric multilayer 500 during fabrication using the method 410. FIGS. 26-31 are not to scale. The method 410 is described in the context of a particular piezoelectric multilayer 500, though other multilayers might be so fabricated. The piezoelectric multilayer 500 being fabricated may be used in a disk drive and/or other device. The method 410 is also described in the context of providing a single piezoelectric multilayer 500 and its associated structures. However, the method 410 may be used to fabricate multiple piezoelectric multilayers at substantially the same time. The method 410 and system are also described in the context of particular layers. However, in some embodiments, such layers may include multiple sublayers. In one embodiment, the method 410 commences after formation of the underlayer(s) or other structures on the substrate on which the piezoelectric multilayer is to reside.

An insulating layer is provided on the substrate, via step 412. The substrate and insulator used may be the same as for the methods 100, 180 and 200.

Figure 26:
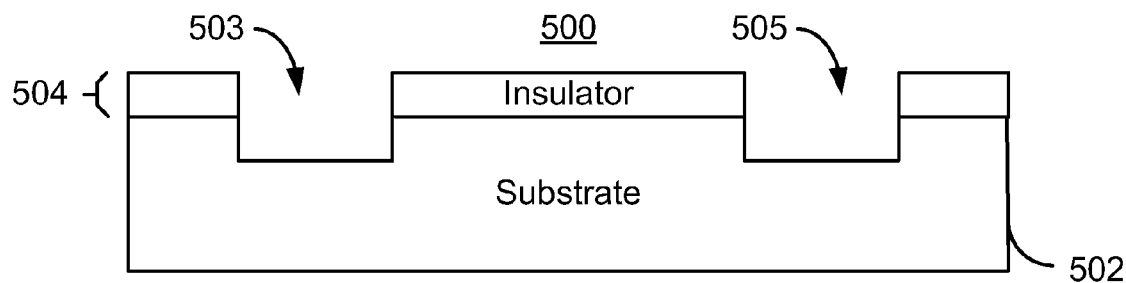
FIGS. 26-31 are diagrams depicting an exemplary embodiment of a piezoelectric multilayer.

A part of the substrate and the insulating layer are removed, via step 412. As a result depressions are provided in the substrate and apertures provided in the insulator. Step 414 may include using photolithographic techniques to provide a mask that exposes only the desired regions of the piezoelectric multilayer. FIG. 26 depicts the piezoelectric multilayer after step 414 is performed. Thus, substrate 502 and insulator 504 are shown. In addition, apertures/depressions 503 and 505 formed in step 414 are shown.

Figure 27:
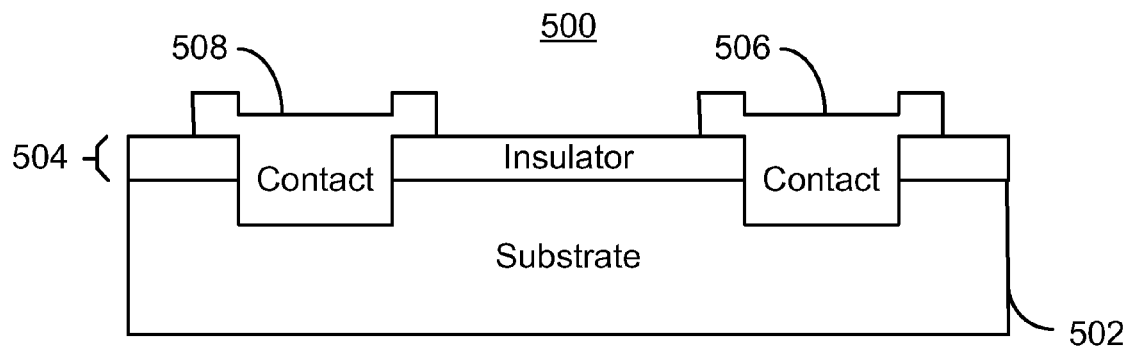
Figure 28:
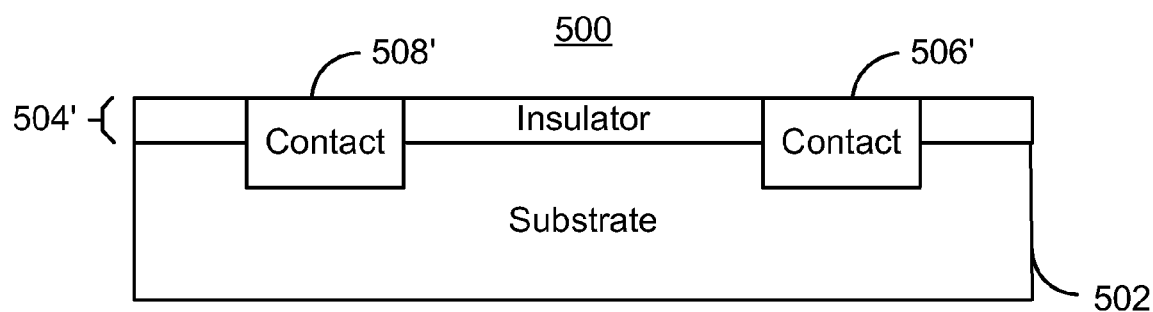

Bottom contacts are provided in the depressions 503 and 505, via step 416. Step 416 may include depositing a seed layer, then plating the contacts. In addition, a planarization step may be used to ensure that the surface is flat for subsequent fabrication of the piezoelectric multilayer. FIG. 27 depicts the piezoelectric multilayer after the contacts 508 and 506 have been deposited. Note that for simplicity, seed layers are not shown. FIG. 28 depicts the piezoelectric multilayer after step 416 has been completed. Consequently, a flat surface may be provided by the insulator 504' and contacts 506' and 508'.

Figure 29:
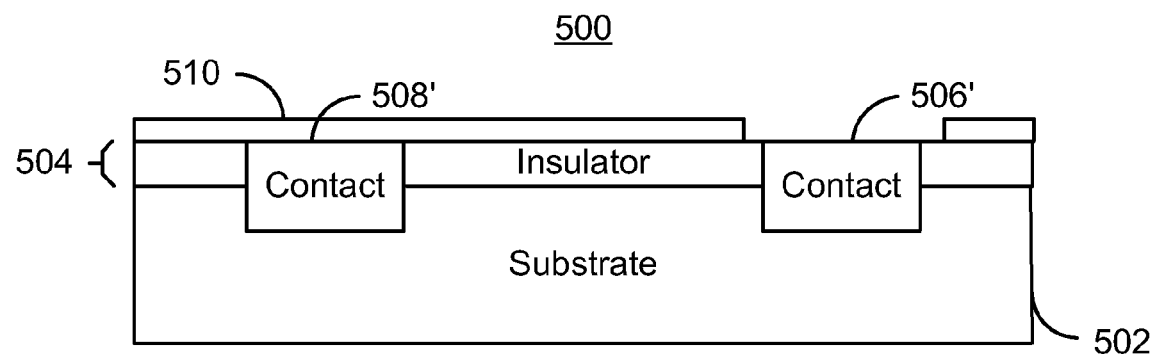
Figure 30:
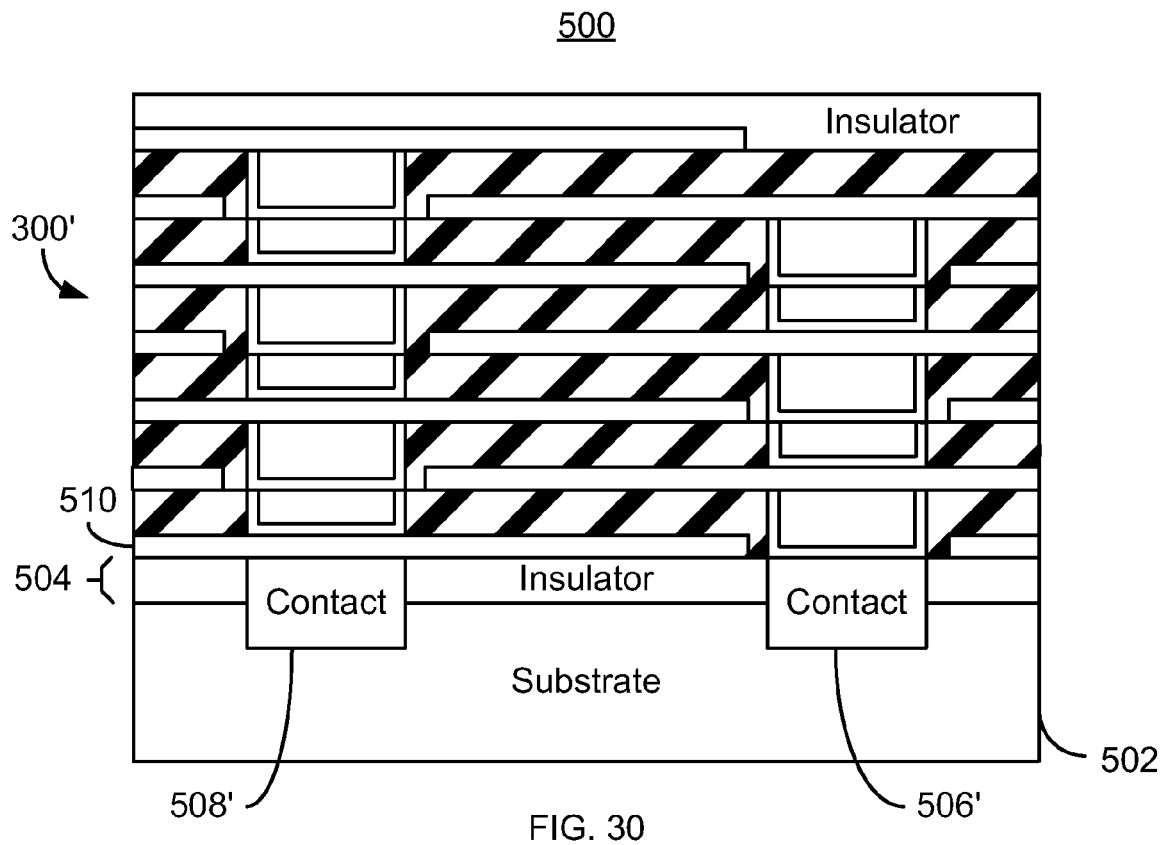
Figure 31:
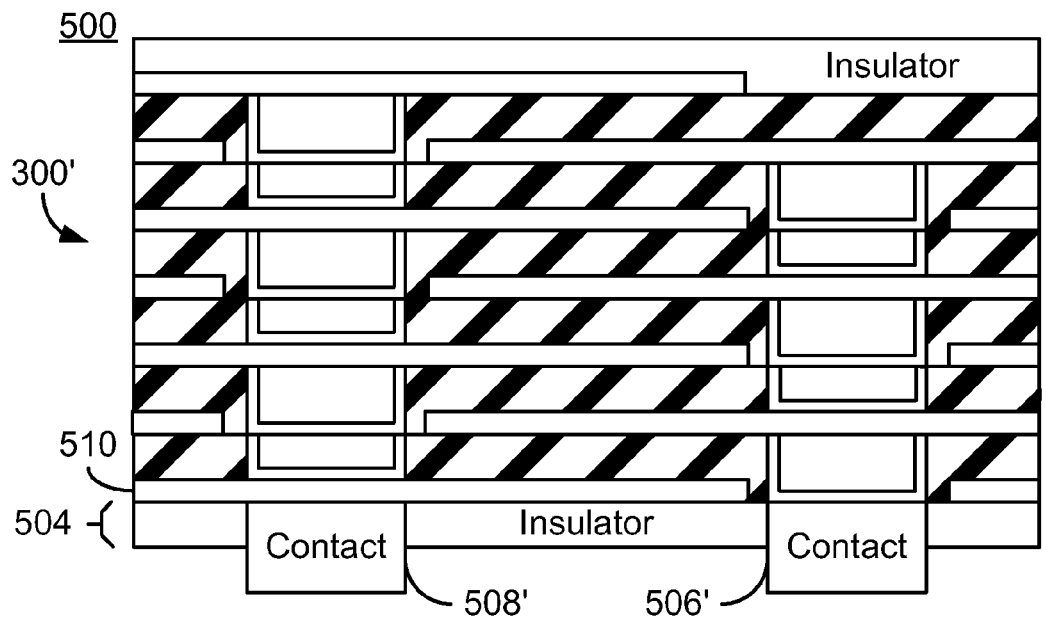

After the layers of the piezoelectric material have been fabricated, the substrate may be removed, via step 418. For example, a deep RIE, a heated chemical bath, or other technique may be used. FIG. 29 depicts the piezoelectric multilayer 500 after the first conductive layer 510 is formed. Note that because bottom contacts are used, the first conductive layer 510 has an aperture therein. The aperture may be formed using photolithography. FIG. 30 depicts the piezoelectric multilayer after the remaining layers have been formed. These layers are analogous to the piezoelectric multilayer 300 and thus are generally denoted as 300'. Note that the contacts 506' and 508' are electrically insulated from each other, but electrically connected to the corresponding conductive plugs and alternating conductive layers. FIG. 31 depicts the piezoelectric multilayer 500 after step 418 has been performed. Thus, the contacts 506' and 508' are exposed. Electrical connection may thus be made to the piezoelectric multilayer 500. Thus, the benefits of the piezoelectric multilayer 500 may be employed in a device.

We claim:

1. A method for fabricating a piezoelectric multilayer comprising:
   depositing a first conductive layer on a substrate;
   depositing a first piezoelectric layer on the first conductive layer;
   removing a portion of the first piezoelectric layer to provide a first aperture therein, the first aperture exposing a portion of the first conductive layer;
   providing a portion of a first conductive plug within the first aperture, the first conductive plug being electrically connected to the first conductive layer;
   depositing a second conductive layer on the first piezoelectric layer;
   removing a portion of the second conductive layer to provide a second aperture therein, the second aperture exposing the first conductive plug and allowing the second conductive layer to be electrically insulated from the first conductive plug;
   depositing a second piezoelectric layer covering the first conductive plug and the second conductive layer;
   removing a portion of the second piezoelectric layer to provide a third aperture and a fourth aperture therein, the third aperture exposing the first conductive plug, the fourth aperture exposing an additional portion of the second conductive layer distal from the first conductive plug;
   providing a second portion of the first conductive plug in the third aperture and a first portion of a second conductive plug in the fourth aperture;
   depositing a third conductive layer electrically coupled to the first conductive plug;
   removing a portion of the third conductive layer to form fifth aperture therein, the fifth aperture exposing the second conductive plug and allowing the third conductive layer to be insulated from the second conductive plug.

2. The method of claim 1 further comprising:
   depositing a third piezoelectric layer covering the first conductive plug and the third conductive layer;
   removing a portion of the third piezoelectric layer to provide a pair of apertures exposing the first conductive plug and the second conductive plug;

providing a portion of the first conductive plug and the second conductive plug in the pair of apertures;

depositing a fourth conductive layer electrically coupled to the second conductive plug.

3. The method of claim 2 further comprising:

removing a portion of the fourth conductive layer to form a sixth aperture therein, the sixth aperture exposing the first conductive plug and allowing the fourth conductive layer to be insulated from the first conductive plug.

4. The method of claim 3 further comprising:

repeating steps of forming piezoelectric and conductive layers further comprising: depositing a fourth piezoelectric layer, removing the portion of the fourth piezoelectric layer to provide a second pair of apertures to expose the first conductive plug and second conductive plug, providing the portion of the first conductive plug and the portion of the second conductive plug in the second pair of apertures, depositing a fifth conductive layer, removing a portion of the fifth conductive layer to form a seventh aperture, depositing a fifth piezoelectric layer, removing a portion of the fifth piezoelectric layer to provide a third pair of apertures to expose the first conductive plug and second conductive plug, providing the portion of the first conductive plug and the second conductive plug in the third pair of apertures, and depositing a sixth conductive layer electrically coupled to the second conductive plug.

5. The method of claim 1 further comprising:

providing an insulating layer between the substrate and the first conductive layer.

6. The method of claim 1 further comprising:

annealing each of the first piezoelectric layer and the second piezoelectric layer after deposition of the first and second piezoelectric layers.

7. The method of claim 1 wherein the step of removing the portion of the first piezoelectric layer further includes:

providing a mask exposing the portion of the first piezoelectric layer; and reactive ion etching the portion of the first piezoelectric layer.

8. The method of claim 7 wherein the step of providing the portion of the first conductive plug further includes:

depositing a seed layer;

electroplating a conductive material, the conductive material filling the first aperture; and planarizing the first piezoelectric layer.

9. The method of claim 1 wherein the step of removing the portion of the second piezoelectric layer further includes:

providing a mask exposing the portion of the second piezoelectric layer; and reactive ion etching the portion of the second piezoelectric layer.

10. The method of claim 9 wherein the step of providing the portion of the first conductive plug and the portion of the second conductive plug further includes:

depositing a seed layer covering at least the third aperture and the fourth aperture;

electroplating a conductive material, the conductive material filling the third aperture and the fourth aperture; and planarizing the second piezoelectric layer.

11. The method of claim 1 further comprising:

depositing an insulating layer on a top conductive layer;

removing a portion of the insulating layer, exposing the first conductive plug and the second conductive plug;

providing interconnects to the first conductive plug and the second conductive plug.

12. The method of claim 1 further comprising:

providing a plurality of bottom electrical contacts.

13. The method of claim 12 wherein the step of providing the bottom electrical contacts further includes:

providing an insulating layer on the substrate;

removing a portion of the substrate and the insulating layer to provide a plurality of depressions in the substrate; and providing the plurality of bottom contacts in the plurality of depressions.

14. The method of claim 13 further comprising:

removing the substrate.

\* \* \* \* \*